(12) United States Patent
Kyogoku et al.

(10) Patent No.: US 10,763,354 B2
(45) Date of Patent: Sep. 1, 2020

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Shinya Kyogoku, Tsukuba (JP); Katsuhisa Tanaka, Tsukuba (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 53 days.

(21) Appl. No.: 16/286,667

(22) Filed: Feb. 27, 2019

(65) Prior Publication Data

US 2020/0035825 A1  Jan. 30, 2020

(30) Foreign Application Priority Data

Jul. 26, 2018 (JP) ................................. 2018-139888

(51) Int. Cl.
*H01L 29/78* (2006.01)
*H01L 29/66* (2006.01)
(Continued)

(52) U.S. Cl.
CPC ...... *H01L 29/7813* (2013.01); *H01L 29/1095* (2013.01); *H01L 29/1608* (2013.01);
(Continued)

(58) Field of Classification Search
CPC ............ H01L 29/7813; H01L 29/1095; H01L 29/1608; H01L 29/41741; H01L 29/66068; H01L 29/66734
See application file for complete search history.

(56) References Cited

U.S. PATENT DOCUMENTS 7,649,223 B2   1/2010 Kawashima
2014/0145206 A1* 5/2014 Siemieniec ......... H01L 29/7804
257/77

(Continued)

FOREIGN PATENT DOCUMENTS

JP  2008-16518     1/2008
JP  2012-169385    9/2012
WO  WO 2012/108165 A1  8/2012

OTHER PUBLICATIONS

Aiko Ichimura, et al. "4H-SiC Trench MOSFET with Ultra-Low On-Resistance by using Miniaturization Technology", International Conference on Silicon Carbide and Related Materials 2017 Materials Science Forum, vol. 924, 2 pages.

*Primary Examiner* — Mark W Tornow
(74) *Attorney, Agent, or Firm* — Oblon, McClelland, Maier & Neustadt, L.L.P.

(57) ABSTRACT

A semiconductor device of an embodiment includes a silicon carbide layer having a first and a second plane, a trench, a gate electrode in the trench, an n-type first silicon carbide region, a p-type second silicon carbide region and a p-type third silicon carbide region provided between the first silicon carbide region and the first plane and interposing the trench therebetween, a p-type sixth silicon carbide region between the first silicon carbide region and the second silicon carbide region, a p-type seventh silicon carbide region between the first silicon carbide region and the third silicon carbide region, an eighth silicon carbide region between the first silicon carbide region and the sixth silicon carbide region, and a ninth silicon carbide region between the first silicon carbide region and the seventh silicon carbide region. The eighth silicon carbide region has a plurality of first regions extending toward the ninth silicon carbide region.

20 Claims, 31 Drawing Sheets

(51) Int. Cl.
*H01L 29/16* (2006.01)
*H01L 29/417* (2006.01)
*H01L 29/10* (2006.01)

(52) U.S. Cl.
CPC .. *H01L 29/41741* (2013.01); *H01L 29/66068* (2013.01); *H01L 29/66734* (2013.01)

(56) References Cited

U.S. PATENT DOCUMENTS

| | | | |
|---|---|---|---|
| 2018/0350976 A1* | 12/2018 | Okumura | H01L 29/045 |
| 2019/0074359 A1* | 3/2019 | Hashizume | H01L 29/4236 |
| 2019/0198619 A1* | 6/2019 | Iijima | H01L 29/401 |
| 2019/0214457 A1* | 7/2019 | Kinoshita | H01L 21/046 |
| 2019/0280118 A1* | 9/2019 | Kobayashi | H01L 29/8083 |
| 2019/0386106 A1* | 12/2019 | Kumada | H01L 29/1608 |
| 2020/0083368 A1* | 3/2020 | Kobayashi | H01L 29/66734 |

* cited by examiner

DD' CROSS SECTION

DD' CROSS SECTION

US 10,763,354 B2

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2018-139888, filed on Jul. 26, 2018, the entire contents of which are incorporated herein by reference.

FIELD

Embodiments described herein relate generally to semiconductor device, inverter circuit, driving device, vehicle, and elevator.

BACKGROUND

Silicon carbide (SiC) is expected as a material for next generation semiconductor devices. Compared to silicon, silicon carbide has superior physical properties such as a band gap of about 3 times, a breakdown field strength of about 10 times, and a thermal conductivity of about 3 times. By utilizing the physical properties, it is possible to realize a semiconductor device capable of operating with low loss and at high temperature.

As a structure for reducing an on-resistance of a MOSFET (Metal Oxide Semiconductor Field Effect Transistor) using silicon carbide, there is a trench gate type MOSFET in which a gate electrode is provided in a trench. In the trench gate type MOSFET, the on-resistance is reduced by increasing the channel density per unit area. In a trench gate type MOSFET, it is expected to realize a structure for further reducing the on-resistance.

DETAILED DESCRIPTION

Figure 1:
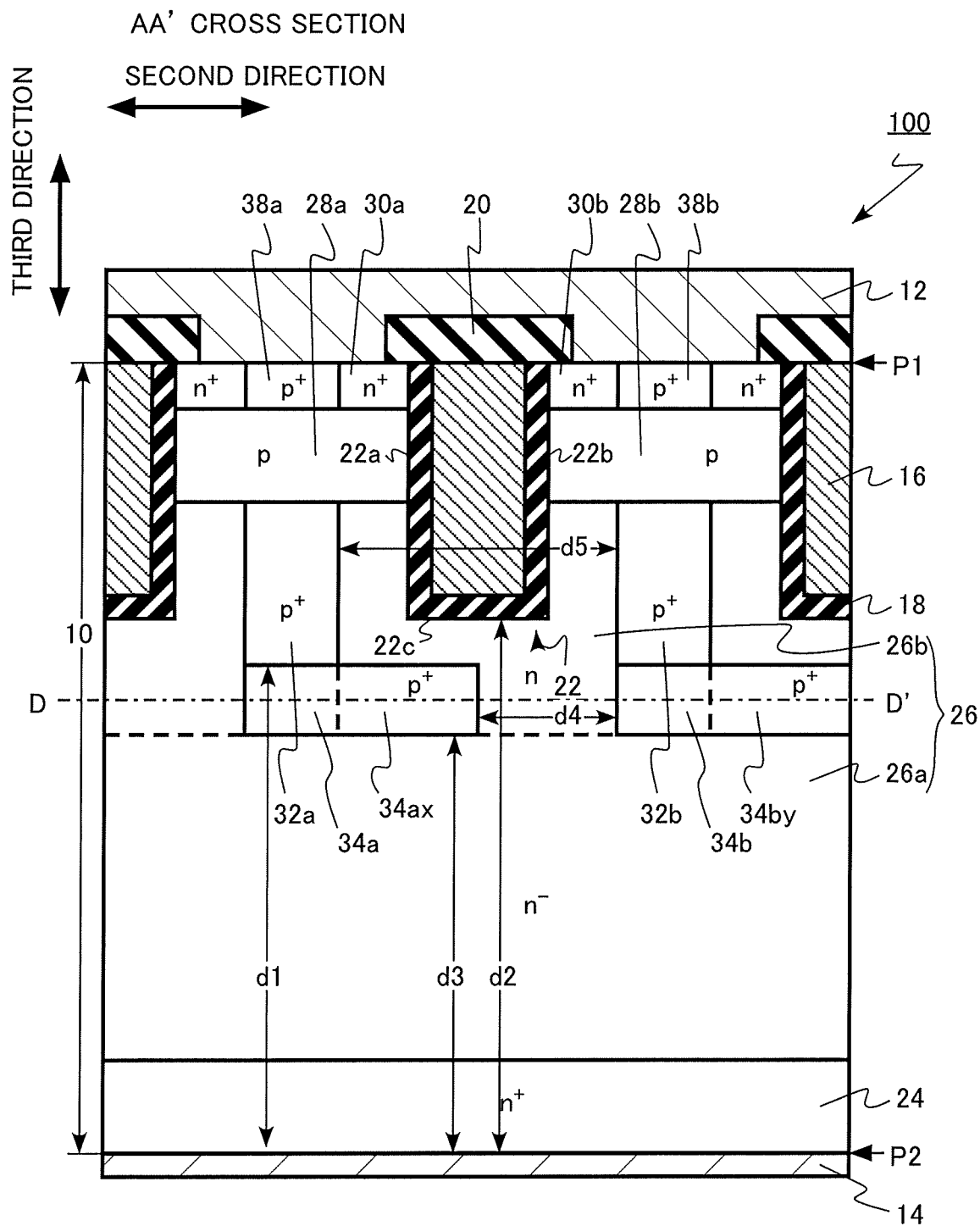
FIG. 1 is a schematic cross-sectional view of a semiconductor device of a first embodiment.

A semiconductor device according to an embodiment includes a silicon carbide layer having a first plane and a second plane facing the first plane, the first plane and the second plane being parallel to a first direction and a second direction perpendicular to the first direction; a first electrode located on a side of the first plane of the silicon carbide layer; a second electrode located on a side of the second plane of the silicon carbide layer; a trench provided in the silicon carbide layer, the trench extending in the first direction on the first plane, and the trench having a first side plane, a second side plane, and a bottom plane between the first side plane and the second side plane; a gate electrode located in the trench; a gate insulating layer located between the gate electrode and the silicon carbide layer; a first silicon carbide region of n-type located in the silicon carbide layer; a second silicon carbide region of p-type located in the silicon carbide layer and located between the first silicon carbide region and the first plane; a third silicon carbide region of p-type located in the silicon carbide layer and between the first silicon carbide region and the first plane, the trench being interposed between the second silicon carbide region and the third silicon carbide region; a fourth silicon carbide region of n-type located in the silicon carbide layer and located between the second silicon carbide region and the first plane; a fifth silicon carbide region of n-type located in the silicon carbide layer and between the third silicon carbide region and the first plane, the trench being interposed between the fourth silicon carbide region and the fifth silicon carbide region; a sixth silicon carbide region of p-type located in the silicon carbide layer and between the first silicon carbide region and the second silicon carbide region, a distance between the second plane and the sixth silicon carbide region being smaller than a distance between the second plane and the bottom plane, and the first silicon carbide region being interposed between the first side plane and the sixth silicon carbide region; a seventh silicon carbide region of p-type located in the silicon carbide layer and between the first silicon carbide region and the third silicon carbide region, a distance between the second plane and the seventh silicon carbide region being smaller than the distance between the second plane and the bottom plane, and the first silicon carbide region being interposed between the second side plane and the seventh silicon carbide region; a eighth silicon carbide region of p-type located in the silicon carbide layer, the eighth silicon carbide region being provided between the first silicon carbide region and the sixth silicon carbide region, the eighth silicon carbide region being connected to the sixth silicon carbide region, and a distance between the second plane and the eighth silicon carbide region being smaller than the distance between the second plane and the bottom plane; and a ninth silicon carbide region of p-type located in the silicon carbide layer, the ninth silicon carbide region being provided between the first silicon carbide region and the seventh silicon carbide region, the ninth silicon carbide region being connected to the seventh silicon carbide region, and a distance between the second plane and the ninth silicon carbide region being smaller than the distance between the second plane and the bottom plane, wherein the eighth silicon carbide region has a plurality of first regions extending toward the ninth silicon carbide region, the first silicon carbide region being interposed between the ninth silicon carbide region and the first regions, and the first regions being repeatedly disposed in the first direction in a plane parallel to the first direction and the second direction.

Hereinafter, embodiments of the present disclosure will be described with reference to the drawings. In the following description, the same or similar members and the like are denoted by the same reference numerals, and the explanation of the members and the like once described is omitted as appropriate.

In addition, in the following description, when notations $n^+$, n, $n^-$, $p^+$, p, and $p^-$ are used, these notations represent relative high and low of impurity concentration in each conductivity type. That is, it is indicated that $n^+$ has a relatively higher n-type impurity concentration than n, and $n^-$ has a relatively lower n-type impurity concentration than n. In addition, it is indicated that $p^+$ has a relatively higher p-type impurity concentration than p, and $p^-$ has a relatively lower p-type impurity concentration than p. Note that sometimes the n-type and $n^-$-type are simply described as n-type, and $p^+$-type and $p^-$-type simply as p-type.

The impurity concentration can be measured by SIMS (Secondary Ion Mass Spectrometry), for example. Further, the relative difference of the impurity concentration can also be judged by the relative carrier concentration obtained by, for example, SCM (Scanning Capacitance Microscopy). Further, the distance such as the depth of the impurity region can be obtained by SIMS, for example. In addition, the distance such as the width and the depth of the impurity region can be obtained from an SCM image, for example.

The shape of the trench, the thickness of the insulating layer, and the like can be measured on, for example, a TEM (Transmission Electron Microscope) image.

First Embodiment

The semiconductor device of the first embodiment includes a silicon carbide layer having a first plane parallel to a first direction and a second direction and a second plane parallel to the first direction and the second direction; a first electrode located on a side of the first plane of the silicon carbide layer; a second electrode located on a side of the second plane of the silicon carbide layer; a trench being provided in the silicon carbide layer, extending in the first direction on the first plane, and having a first side plane, a second side plane, and a bottom plane between the first side plane and the second side plane; a gate electrode located in the trench; a gate insulating layer located between the gate electrode and the silicon carbide layer; an n-type first silicon carbide region located in the silicon carbide layer; a p-type second silicon carbide region located in the silicon carbide layer and located between the first silicon carbide region and the first plane; a p-type third silicon carbide region being located in the silicon carbide layer and between the first silicon carbide region and the first plane, and interposing the trench between the second silicon carbide region and the third silicon carbide region; an n-type fourth silicon carbide region located in the silicon carbide layer and located between the second silicon carbide region and the first plane; an n-type fifth silicon carbide region being located in the silicon carbide layer and between the third silicon carbide region and the first plane, and interposing the trench between the fourth silicon carbide region and the fifth silicon carbide region; a p-type sixth silicon carbide region being located in the silicon carbide layer and between the first silicon carbide region and the second silicon carbide region, having a distance between the second plane and the sixth silicon carbide region smaller than a distance between the second plane and the bottom plane, and interposing the first silicon carbide region between the first side plane and the sixth silicon carbide region; a p-type seventh silicon carbide region being located in the silicon carbide layer and between the first silicon carbide region and the third silicon carbide region, having a distance between the second plane and the seventh silicon carbide region smaller than the distance between the second plane and the bottom plane, and interposing the first silicon carbide region between the second side plane and the seventh silicon carbide region; a p-type eighth silicon carbide region being located in the silicon carbide layer, provided between the first silicon carbide region and the sixth silicon carbide region, and connected to the sixth silicon carbide region, and having a distance between the second plane and the eighth silicon carbide region smaller than the distance between the second plane and the bottom plane; and a p-type ninth silicon carbide region being located in the silicon carbide layer, provided between the first silicon carbide region and the seventh silicon carbide region, and connected to the seventh silicon carbide region, and having a distance between the second plane and the ninth silicon carbide region smaller than the distance between the second plane and the bottom plane, wherein the eighth silicon carbide region has a plurality of first regions extending toward the ninth silicon carbide region, interposing the first silicon carbide region between the ninth silicon carbide region and the first regions, and being repeatedly disposed in the first direction in a plane parallel to the first direction and the second direction.

FIG. 1 is a schematic cross-sectional view of a semiconductor device of the first embodiment. The semiconductor device of the first embodiment is a trench gate type vertical MOSFET 100 using silicon carbide. The MOSFET 100 is an n-channel MOSFET using electrons as a carrier.

Figure 2:
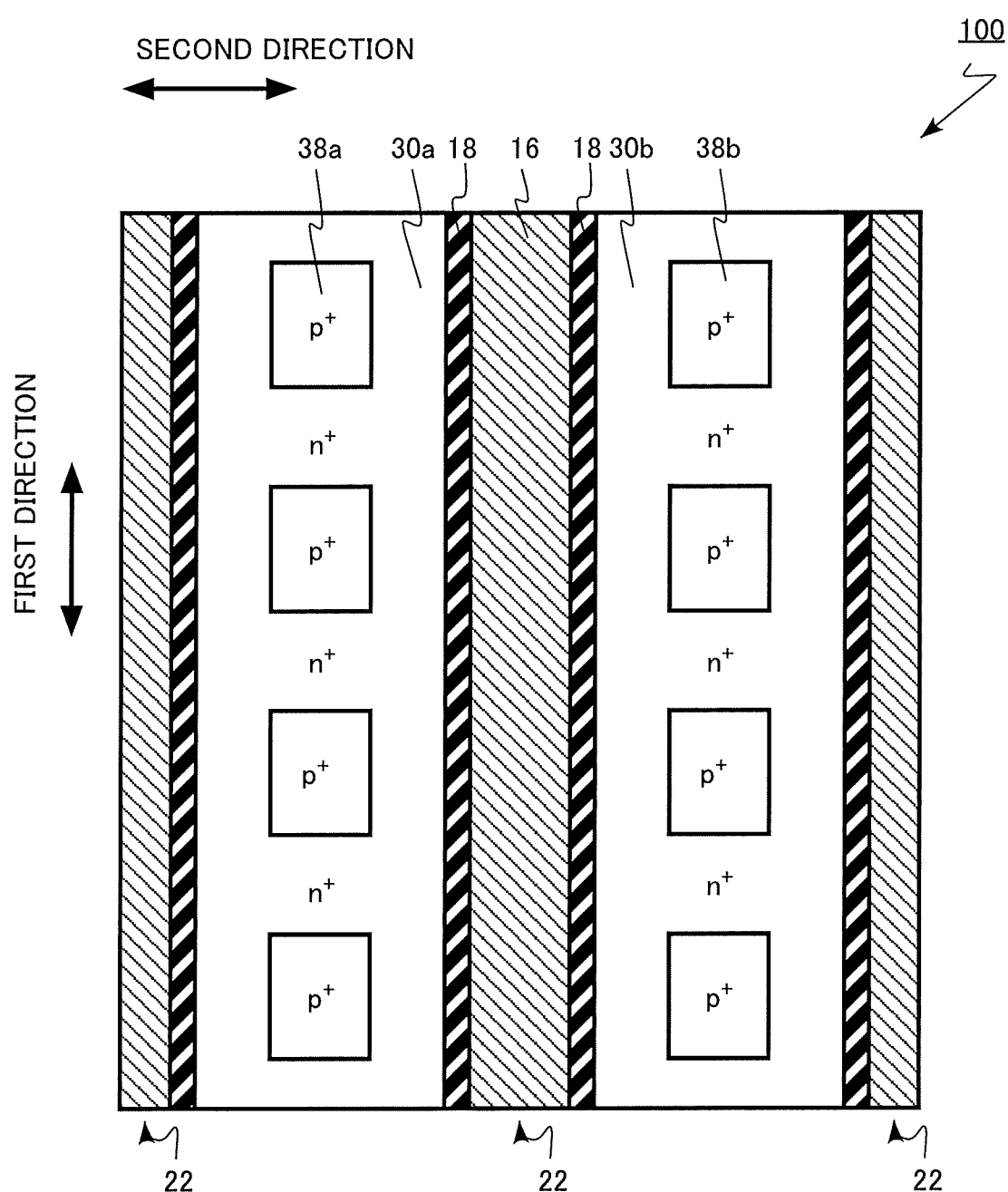
FIG. 2 is a schematic plan view of the semiconductor device of the first embodiment.

FIG. 2 is a schematic plan view of the semiconductor device of the first embodiment. FIG. 2 is a plan view of a first plane (P1 in FIG. 1) of FIG. 1. The first direction and the second direction are parallel to the first plane P1. The second direction is a direction perpendicular to the first direction.

Figure 3:
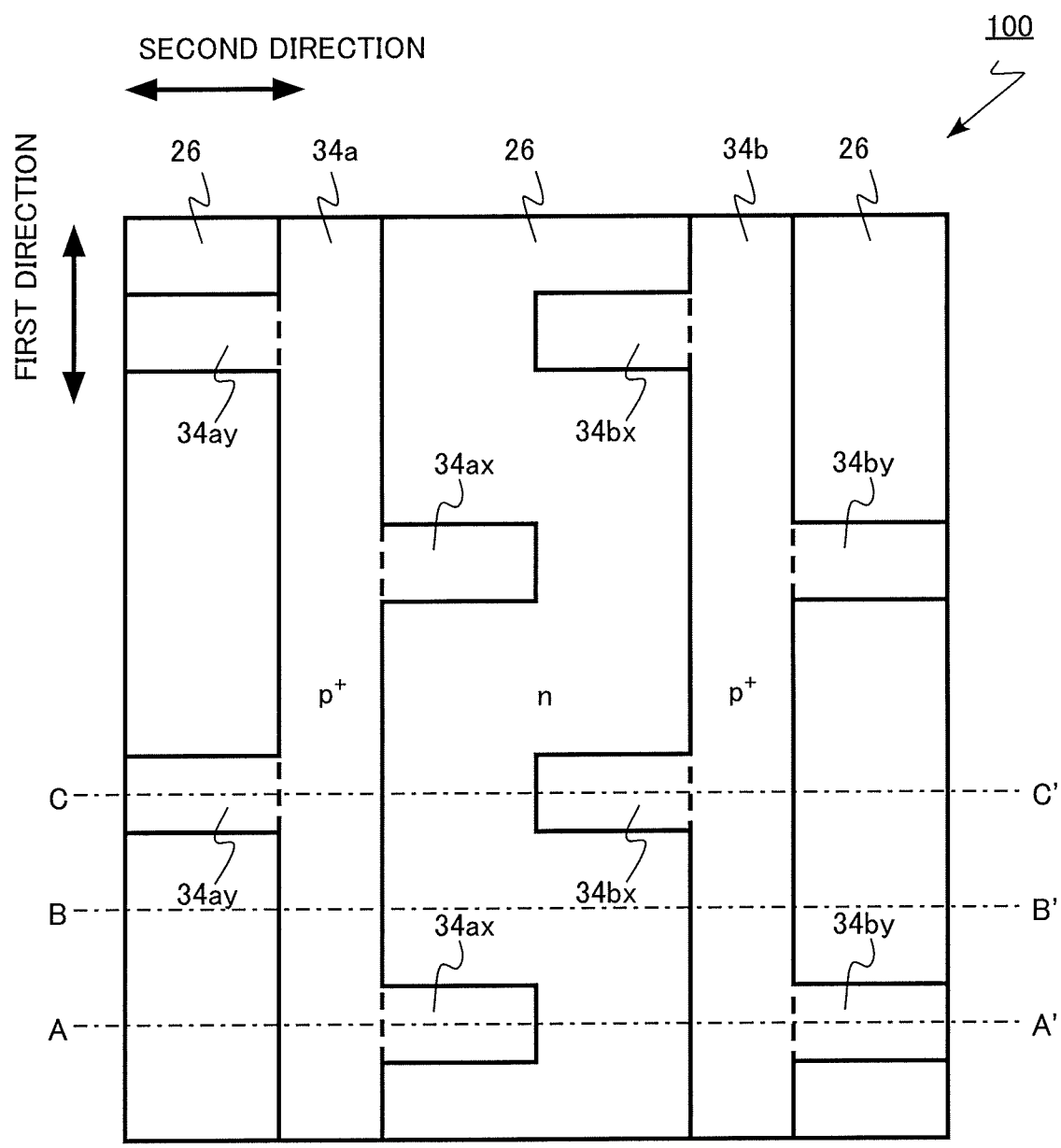
FIG. 3 is a schematic cross-sectional view of the semiconductor device of the first embodiment.

FIG. 3 is a schematic cross-sectional view of the semiconductor device of the first embodiment. FIG. 3 is a cross-sectional view taken along the line DD' of FIG. 1. FIG. 3 is a cross section parallel to the first direction and the second direction. FIG. 3 is a cross section parallel to the first plane P1. FIG. 1 is a cross section taken along the line AA' in FIG. 3.

Figure 4:
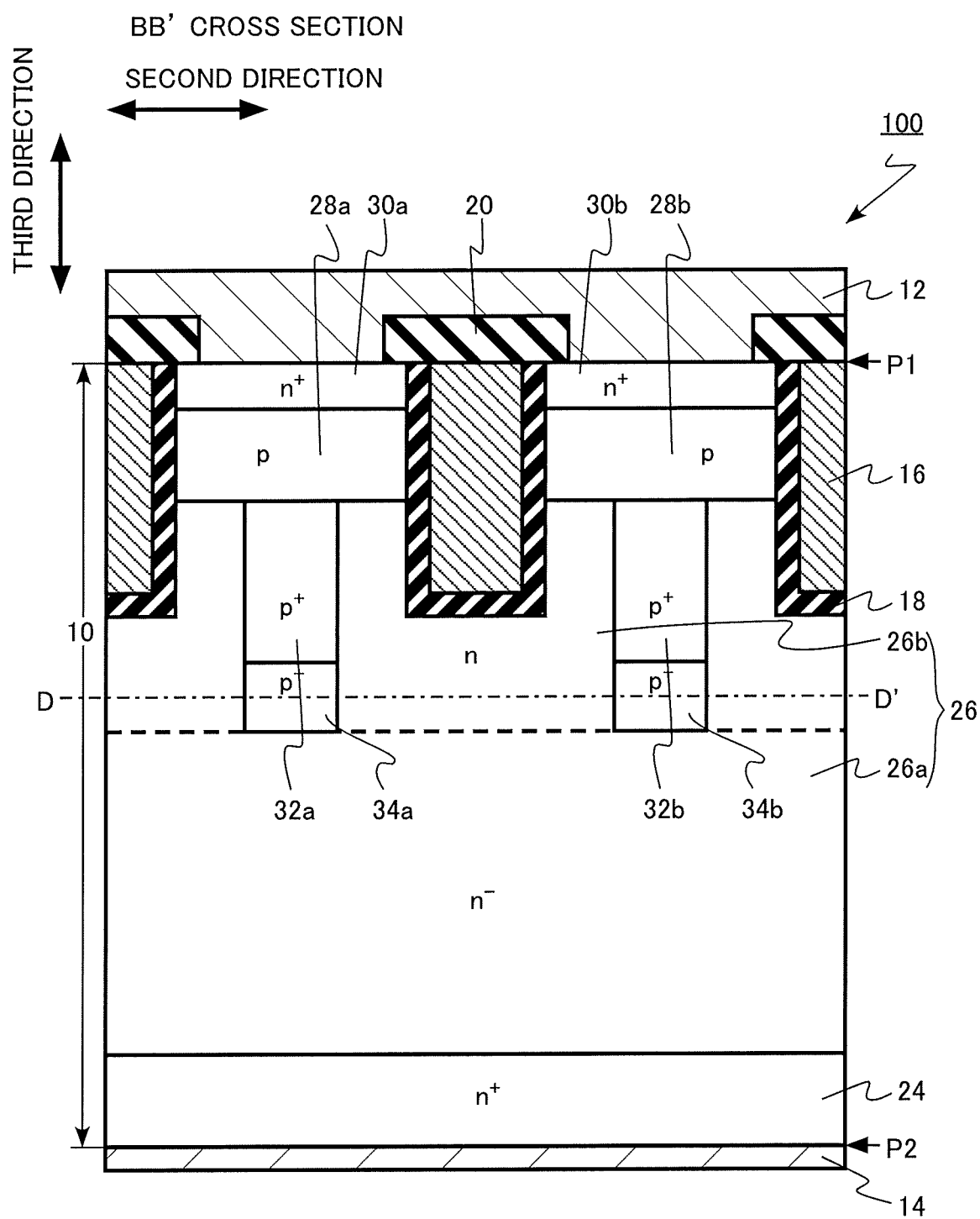
FIG. 4 is a schematic cross-sectional view of the semiconductor device of the first embodiment.

FIG. 4 is a schematic cross-sectional view of the semiconductor device of the first embodiment. FIG. 4 is a cross-sectional view taken along the line BB' of FIG. 3.

Figure 5:
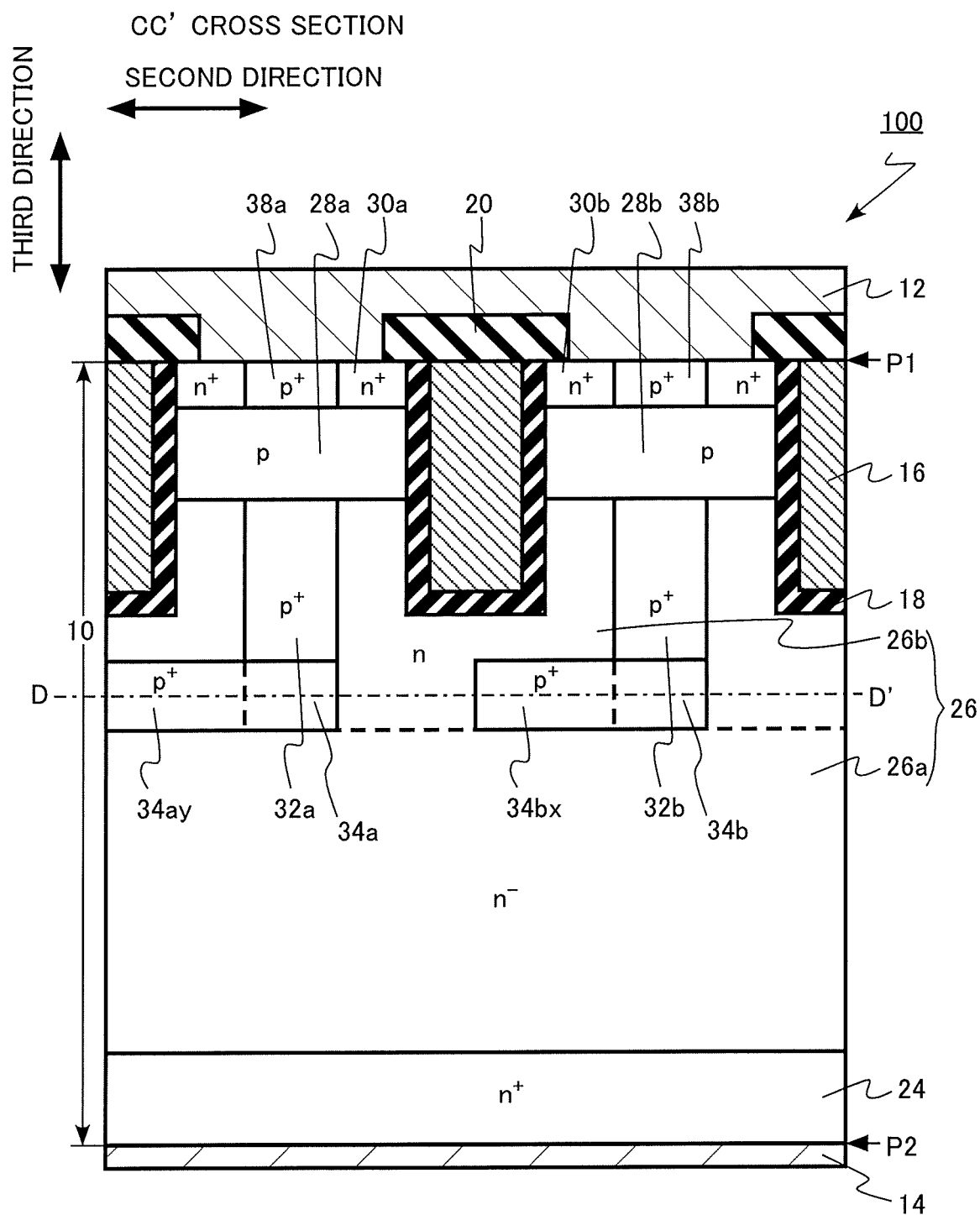
FIG. 5 is a schematic cross-sectional view of the semiconductor device of the first embodiment.

FIG. 5 is a schematic cross-sectional view of the semiconductor device of the first embodiment. FIG. 5 is a cross-sectional view taken along the line CC' of FIG. 3.

The MOSFET 100 includes a silicon carbide layer 10, a source electrode 12 (a first electrode), a drain electrode 14 (a second electrode), a gate electrode 16, a gate insulating layer 18, an interlayer insulating layer 20, and a trench 22.

In the silicon carbide layer 10, an $n^+$-type drain region 24, an $n^-$-type and n-type drift region 26 (a first silicon carbide region), a p-type first body region 28a (a second silicon carbide region), a p-type second body region 28b (a third silicon carbide region), an $n^+$-type first source region 30a (a fourth silicon carbide region), an $n^+$-type second source region 30b (a fifth silicon carbide region), a $p^+$-type first upper electric field relaxation region 32a (a sixth silicon carbide region), a $p^+$-type second upper electric field relaxation region 32b (a seventh silicon carbide region), a $p^+$-type first lower electric field relaxation region 34a (an eighth silicon carbide region), a $p^+$-type second lower electric field relaxation region 34b (a ninth silicon carbide region), a $p^+$-type first contact region 38a, and a $p^+$-type second contact region 38b are located.

The silicon carbide layer 10 is single crystal SiC. The silicon carbide layer 10 is, for example, 4H—SiC.

The silicon carbide layer 10 includes a first plane ("P1" in FIG. 1) and a second plane ("P2" in FIG. 1). The second plane P2 facing the first plane P2. Hereinafter, the first plane P1 is also referred to as a front surface and the second plane P2 is also referred to as a back surface. Hereinafter, "depth" means a depth with reference to the first plane P1.

In FIGS. 1 and 2, the first direction and the second direction are parallel to the first plane P1 and the second plane P2. The third direction is perpendicular to the first plane P1 and the second plane P2.

For example, the first plane P1 is a plane inclined at 0 degrees or more and 8 degrees or less with respect to the (0001) face. That is, the plane is a plane in which the normal is inclined at 0 degrees or more and 8 degrees or less with respect to a c axis in the [0001] direction. In other words, the off angle with respect to a (0001) face is 0 degrees or more and 8 degrees or less. Further, the second plane P2 is, for example, a plane inclined at an angle of 0 degrees or more and 8 degrees or less with respect to a (000-1) face.

The (0001) face is called a silicon face. The (000-1) face is called a carbon face. The inclination direction of the first plane P1 and the second plane P2 is, for example, a [11-20] direction. The [11-20] direction is an a-axis direction. In FIG. 1, for example, the second direction shown in the drawing is the a-axis direction.

The trench 22 is provided in the silicon carbide layer 10. The trench 22 extends in the first direction as shown in FIG. 2. The trench 22 is repeatedly disposed in the second direction as shown in FIG. 2. The repetitive pitch in the second direction of the trench 22 is, for example, 2 µm or more and 6 µm or less. The depth of the trench 22 is, for example, 1 µm or more and 2 µm or less.

The trench 22 has a first side plane 22a, a second side plane 22b, and a bottom plane 22c. The bottom plane 22c is located between the first side plane 22a and the second side plane 22b.

The gate electrode 16 is located in the trench 22. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is located between the gate electrode 16 and the silicon carbide layer 10. The gate insulating layer 18 is provided between each region of the first source region 30a, the second source region 30b, the first body region 28a, the second body region 28b, and the high-concentration region 26b and the gate electrode 16.

The gate insulating layer 18 is, for example, a silicon oxide film. As the gate insulating layer 18, for example, a high-k insulating film (a high dielectric constant insulating film such as HfSiON, ZrSiON, AlON) can be applied. For the gate insulating layer 18, for example, a laminated film of a silicon oxide film ($SiO_2$) and a high-K insulating film can also be applied.

The interlayer insulating layer 20 is provided on the gate electrode 16. The interlayer insulating layer 20 is, for example, a silicon oxide film.

The source electrode 12 is provided on the front surface side of the silicon carbide layer 10. The source electrode 12 is provided on the front surface of the silicon carbide layer 10. The source electrode 12 is in contact with the first source region 30a, the second source region 30b, the first contact region 38a, and the second contact region 38b.

The source electrode 12 contains a metal. The metal forming the source electrode 12 is, for example, a laminated structure of titanium (Ti) and aluminum (Al).

The source electrode 12 may contain metal silicide or metal carbide in contact with the silicon carbide layer 10.

The drain electrode 14 is provided on the back surface side of the silicon carbide layer 10. The drain electrode 14 is provided on the back surface of the silicon carbide layer 10. The drain electrode 14 is in contact with the drain region 24.

The drain electrode 14 is, for example, a metal or a metal semiconductor compound. The drain electrode 14 includes a material selected from the group consisting of, for example, nickel silicide (NiSi), titanium (Ti), nickel (Ni), silver (Ag), and gold (Au).

The $n^+$-type drain region 24 is provided on the back surface side of the silicon carbide layer 10. The drain region 24 contains, for example, nitrogen (N) as an n-type impurity. The impurity concentration of the n-type impurity in the drain region 24 is, for example, $1 \times 10^{18}$ cm$^{-3}$ or more and $1 \times 10^{21}$ cm$^{-3}$ or less.

The n$^-$-type drift region 26 is provided on the drain region 24. The drift region 26 has a low-concentration region 26a and a high-concentration region 26b. The high-concentration region 26b is provided between the low-concentration region 26a and the front surface of the silicon carbide layer 10. The high-concentration region 26b is provided between the low-concentration region 26a and the first body region 28a and between the low-concentration region 26a and the second body region 28b.

The high-concentration region 26b is in contact with, for example, the first side plane 22a, the second side plane 22b, and the bottom plane 22c.

The drift region 26 contains, for example, nitrogen (N) as an n-type impurity. The n-type impurity concentration in the high-concentration region 26b is higher than the n-type impurity concentration in the low-concentration region 26a. The impurity concentration of the n-type impurity in the low-concentration region 26a is, for example, $4 \times 10^{14}$ cm$^{-3}$ or more and $1 \times 10^{17}$ cm$^{-3}$ or less.

The impurity concentration of the n-type impurity in the high-concentration region 26b is, for example, $4 \times 10^{16}$ cm$^{-1}$ or more and $1 \times 10^{18}$ cm$^{-3}$ or less. The thickness of the drift region 26 is, for example, 5 μm or more and 150 μm or less.

The p-type first body region 28a is provided between the drift region 26 and the front surface of the silicon carbide layer 10. The first body region 28a is in contact with the first side plane 22a. The p-type second body region 28b is provided between the drift region 26 and the front surface of the silicon carbide layer 10. A trench 22 is interposed between the first body region 28a and the second body region 28b. The second body region 28b is in contact with the second side plane 22b.

The first body region 28a and the second body region 28b function as a channel region of the MOSFET 100. For example, when the MOSFET 100 is turned on, a channel in which electrons flow is formed in a region of the first body region 28a in contact with the gate insulating layer 18 and a region of the second body region 28b in contact with the gate insulating layer 18. A region of the first body region 28a in contact with the gate insulating layer 18 and a region of the second body region 28b in contact with the gate insulating layer 18 become a channel formation region.

The first body region 28a and the second body region 28b contain, for example, aluminum (Al) as a p-type impurity. The impurity concentration of the p-type impurity in the first body region 28a and the second body region 28b is, for example, $5 \times 10^{16}$ cm$^{-3}$ or more and $5 \times 10^{17}$ cm$^{-3}$ or less.

The depth of the first body region 28a and the second body region 28b is, for example, 0.2 μm or more and 1.0 μm or less.

The n$^+$-type first source region 30a is provided between the first body region 28a and the front surface of the silicon carbide layer 10. The first source region 30a is in contact with the source electrode 12. The first source region 30a is in contact with the gate insulating layer 18.

The n$^+$-type second source region 30b is provided between the second body region 28b and the front surface of the silicon carbide layer 10. The second source region 30b is in contact with the source electrode 12. The second source region 30b is in contact with the gate insulating layer 18.

A trench is interposed between the first source region 30a and the second source region 30b. The first source region 30a and the second source region 30b contain, for example, phosphorus (P) as an n-type impurity. The impurity concentration of the n-type impurity in the first source region 30a and the second source region 30b is higher than the impurity concentration of the n-type impurity in the drift region 26.

The impurity concentration of the n-type impurity in the first source region 30a and the second source region 30b is, for example, $1 \times 10^{19}$ cm$^{-3}$ or more and $1 \times 10^{21}$ cm$^{-3}$ or less. The depths of the first source region 30a and the second source region 30b are shallower than the depths of the first body region 28a and the second body region 28b, for example, 0.1 μm or more and 0.3 μm or less. The distance between the drift region 26 and the first source region 30a and the second source region 30b is, for example, 0.1 μm or more and 0.9 μm or less.

The p$^+$-type first contact region 38a is provided between the first body region 28a and the front surface of the silicon carbide layer 10. The first contact region 38a is in contact with the source electrode 12.

The p$^+$-type second contact region 38b is provided between the second body region 28b and the front surface of the silicon carbide layer 10. The second contact region 38b is in contact with the source electrode 12.

The first contact region 38a and the second contact region 38b contain, for example, aluminum (Al) as a p-type impurity. The impurity concentration of the p-type impurity in the first contact region 38a and the second contact region 38b is higher than the impurity concentration of the p-type impurity in the first body region 28a and the second body region 28b, for example.

The impurity concentration of the p-type impurity in the first contact region 38a and the second contact region 38b is, for example, $1 \times 10^{18}$ cm$^{-3}$ or more and $1 \times 10^{21}$ cm$^{-3}$ or less. In addition, the contact portion with the source electrode 12 is preferably high concentration, for example, $1 \times 10^{19}$ cm$^{-3}$ or more and $1 \times 10^{21}$ cm$^{-3}$ or less.

The p$^+$-type first upper electric field relaxation region 32a is located between the low-concentration region 26a of the drift region 26 and the first body region 28a. A high-concentration region 26b of the drift region 26 is interposed between the first side plane 22a of the trench 22 and the first upper electric field relaxation region 32a.

The distance (d1 in FIG. 1) between the first upper electric field relaxation region 32a and the back surface of the silicon carbide layer 10 is smaller than the distance (d2 in FIG. 1) between the back surface and the bottom plane 22c of the trench 22. In other words, the depth of the first upper electric field relaxation region 32a is deeper than the depth of the trench 22.

The p$^+$-type second upper electric field relaxation region 32b is located between the low-concentration region 26a of the drift region 26 and the second body region 28b. The high-concentration region 26b of the drift region 26 is interposed between the second side plane 22b of the trench 22 and the second upper electric field relaxation region 32b.

The distance between the second upper electric field relaxation region 32b and the back surface of the silicon carbide layer 10 is smaller than the distance (d2 in FIG. 1) between the back surface and the bottom plane 22c of the trench 22. In other words, the depth of the second upper electric field relaxation region 32b is deeper than the depth of the trench 22. The second upper electric field relaxation region 32b has a configuration similar to that of the first upper electric field relaxation region 32a.

The first upper electric field relaxation region 32a and the second upper electric field relaxation region 32b contain, for example, aluminum (Al) as a p-type impurity. The impurity concentration of the p-type impurity in the first upper electric field relaxation region 32a and the second upper electric field relaxation region 32b is, for example, higher than the impurity concentration of the p-type impurity in the first body region 28a and the second body region 28b. The impurity concentration of the p-type impurity in the first upper electric field relaxation region 32a and the second upper electric field relaxation region 32b is, for example, $1 \times 10^{17}$ cm$^{-3}$ or more and $1 \times 10^{20}$ cm$^{-3}$ or less.

The potentials of the first upper electric field relaxation region 32a and the second upper electric field relaxation region 32b are fixed to the source potential. The first upper electric field relaxation region 32a and the second upper electric field relaxation region 32b have a function of relaxing an electric field applied to the gate insulating layer 18. In particular, it has a function to relax the electric field applied to the gate insulating layer 18 at the bottom of the trench 22.

The p$^+$-type first lower electric field relaxation region 34a is located between the low-concentration region 26a of the drift region 26 and the first upper electric field relaxation region 32a. The first lower electric field relaxation region 34a is connected to the first upper electric field relaxation region 32a.

The distance (d3 in FIG. 1) between the first lower electric field relaxation region 34a and the back surface of the silicon carbide layer 10 is smaller than the distance (d2 in FIG. 1) between the back surface and the bottom plane 22c of the trench 22. In other words, the depth of the first lower electric field relaxation region 34a is deeper than the depth of the trench 22.

The distance d3 between the first lower electric field relaxation region 34a and the back surface of the silicon carbide layer 10 is smaller than the distance d1 between the first upper electric field relaxation region 32a and the back surface of the silicon carbide layer 10. In other words, the depth of the first lower electric field relaxation region 34a is deeper than that of the first upper electric field relaxation region 32a.

The thickness of the silicon carbide layer 10 in the first lower electric field relaxation region 34a in the direction from the front surface to the back surface (third direction) is, for example, 0.2 µm or more and 0.5 µm or less.

The p$^+$-type second lower electric field relaxation region 34b is located between the low-concentration region 26a of the drift region 26 and the second upper electric field relaxation region 32b. The second lower electric field relaxation region 34b is connected to the second upper electric field relaxation region 32b.

The distance between the second lower electric field relaxation region 34b and the back surface of the silicon carbide layer 10 is smaller than the distance (d2 in FIG. 1) between the back surface and the bottom plane 22c of the trench 22. In other words, the depth of the second lower electric field relaxation region 34b is deeper than the depth of the trench 22.

The distance between the second lower electric field relaxation region 34b and the back surface of the silicon carbide layer 10 is smaller than the distance between the second upper electric field relaxation region 32b and the back surface of the silicon carbide layer 10. In other words, the depth of the second lower electric field relaxation region 34b is deeper than the depth of the second upper electric field relaxation region 32b.

The thickness of the silicon carbide layer 10 in the second lower electric field relaxation region 34b in the direction from the front surface to the back surface (third direction) is, for example, 0.2 µm or more and 0.5 µm or less.

The impurity concentration of the p-type impurity in the first lower electric field relaxation region 34a and the second lower electric field relaxation region 34b is, for example, higher than the impurity concentration of the p-type impurity in the first body region 28a and the second body region 28b. The impurity concentration of the p-type impurity in the first lower electric field relaxation region 34a and the second lower electric field relaxation region 34b is, for example, $1 \times 10^{17}$ cm$^{-3}$ or more and $1 \times 10^{20}$ cm$^3$ or less.

The first lower electric field relaxation region 34a has a plurality of first regions 34ax and a plurality of third regions 34ay. The first region 34ax extends toward the second lower electric field relaxation region 34b. The first region 34ax extends in the second direction.

The first region 34ax interposes the drift region 26 between the second lower electric field relaxation region 34b and the first region 34ax. For example, the distance (d4 in FIG. 1) between the first region 34ax and the second lower electric field relaxation region 34b is not more than half the distance (d5 in FIG. 1) between the first upper electric field relaxation region 32a and the second upper electric field relaxation region 32b.

The first region 34ax is repeatedly disposed in the first direction in a plane parallel to the first plane P1 and the second plane P2. The drift region 26 is interposed between the two first regions 34ax.

For example, the drift region 26 is interposed between the first region 34ax and the bottom plane 22c of the trench 22.

The third region 34ay extends in the second direction. The third region 34ay extends in a direction opposite to the first region 34ax. The third region 34ay is repeatedly disposed in the first direction in a plane parallel to the first plane P1 and the second plane P2. The drift region 26 is interposed between the two third regions 34ay.

The second lower electric field relaxation region 34b has a plurality of second regions 34bx and a plurality of fourth regions 34by. The second region 34bx extends toward the first lower electric field relaxation region 34a. The second region 34bx extends in the second direction.

The drift region 26 is interposed between the second region 34bx and the first lower electric field relaxation region 34a. For example, the distance between the second region 34bx and the first lower electric field relaxation region 34a is not more than half the distance (d5 in FIG. 1) between the first upper electric field relaxation region 32a and the second upper electric field relaxation region 32b.

The second region 34bx is repeatedly disposed in the first direction in a plane parallel to the first plane P1 and the second plane P2. The drift region 26 is interposed between the two second regions 34bx.

For example, the drift region 26 is interposed between the second region 34bx and the bottom plane 22c of the trench 22.

The fourth region 34by extends in the second direction. The fourth region 34by extends in the direction opposite to the second region 34bx. The fourth region 34by is repeatedly disposed in the first direction in a plane parallel to the first plane P1 and the second plane P2. The drift region 26 is interposed between the two fourth regions 34by.

For example, the first regions 34ax and the second regions 34bx are alternately disposed in the first direction, as shown in FIG. 3. The first regions 34ax and the second regions 34bx are alternately disposed one by one in the first direction. Further, for example, the disposition pitch in the case where the first regions 34ax and the second regions 34bx are alternately disposed is constant, respectively. For example, the disposition pitch in the case where the first regions 34ax and the second regions 34bx are alternately disposed is substantially equal.

The potentials of the first lower electric field relaxation region 34a and the second lower electric field relaxation region 34b are fixed to the source potential. The first lower electric field relaxation region 34a and the second lower electric field relaxation region 34b have a function of relaxing an electric field applied to the gate insulating layer 18. In particular, it has a function to relax the electric field applied to the gate insulating layer 18 at the bottom of the trench 22.

Next, an example of the method of manufacturing the semiconductor device of the first embodiment will be described.

FIGS. 6, 7, 8, 9, 10, 11, and 12 are schematic cross-sectional views showing an example of the method of manufacturing the semiconductor device of the first embodiment. FIGS. 6, 7, 8, 9, 10, 11, and 12 show cross sections corresponding to FIG. 1.

Figure 6:
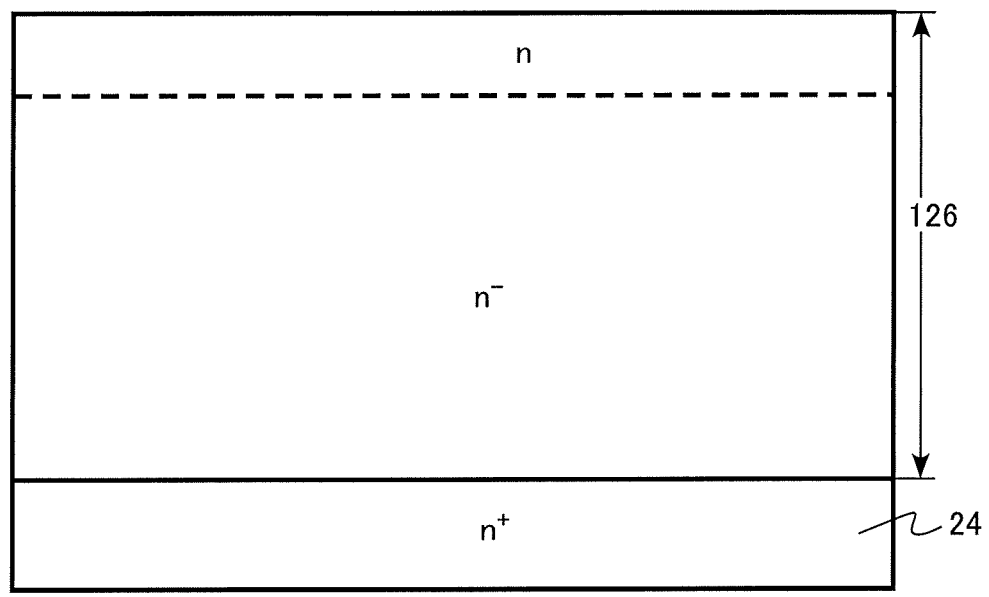
FIG. 6 is a schematic cross-sectional view showing an example of a method of manufacturing the semiconductor device of the first embodiment.

First, a silicon carbide layer having an $n^+$-type drain region 24 and an $n^-$-type and n-type first epitaxial layer 126 is prepared (FIG. 6). The first epitaxial layer 126 finally becomes a part of the drift region 26.

Figure 7:
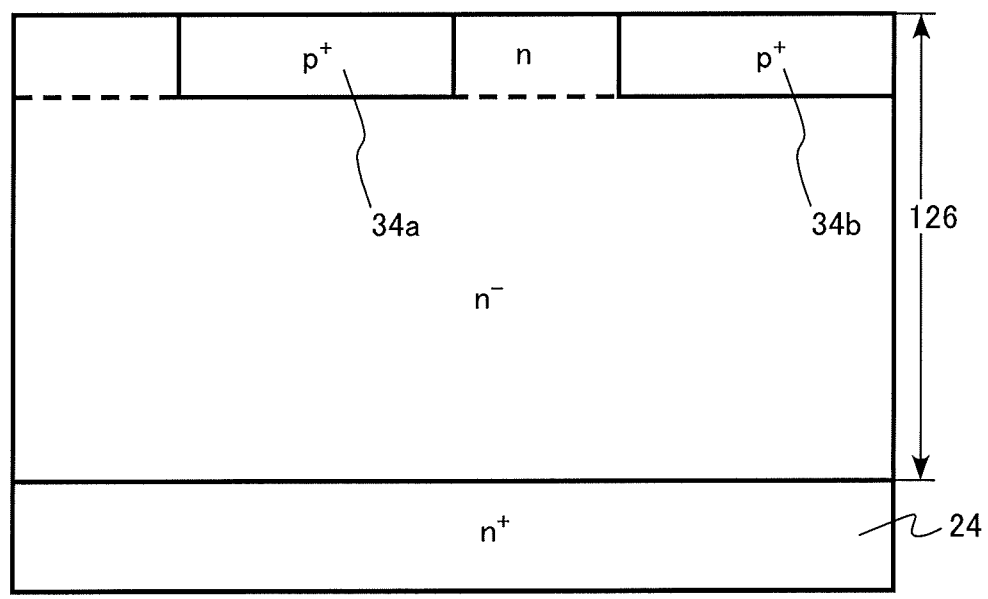
FIG. 7 is a schematic cross-sectional view showing an example of the method of manufacturing the semiconductor device of the first embodiment.

Next, a first lower electric field relaxation region 34a and a second lower electric field relaxation region 34b are formed in the first epitaxial layer 126 by an ion implantation method (FIG. 7).

Figure 8:
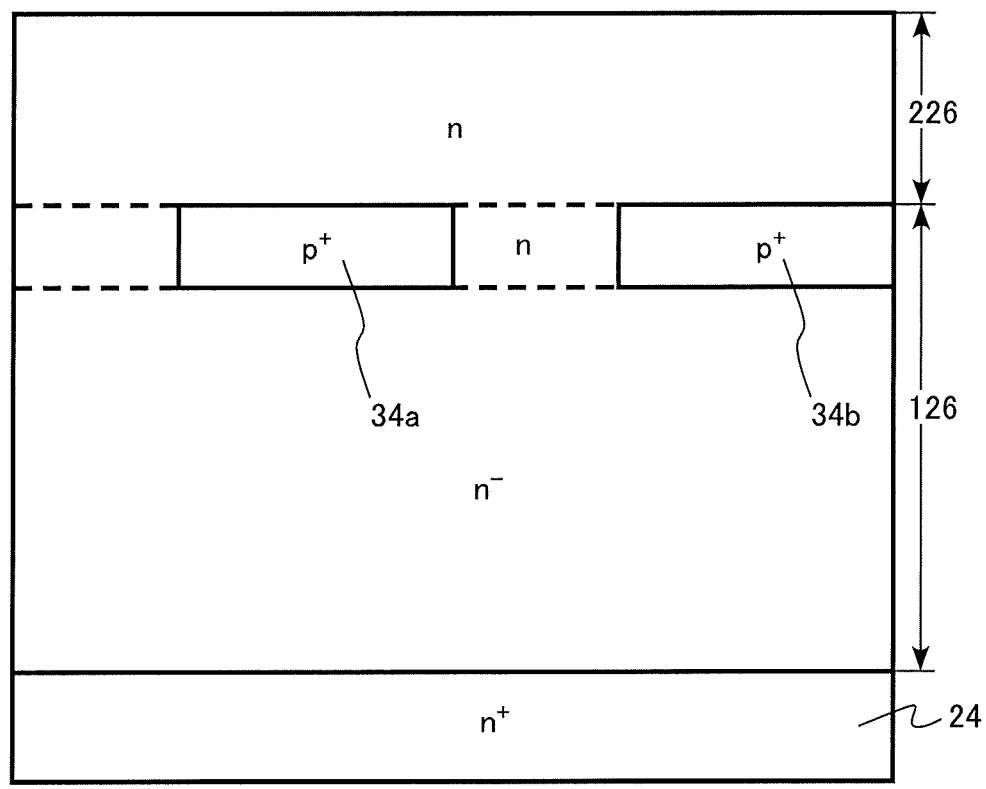
FIG. 8 is a schematic cross-sectional view showing an example of the method of manufacturing the semiconductor device of the first embodiment.

Next, an n-type second epitaxial layer 226 is formed on the front surface of the first epitaxial layer 126 (FIG. 8). The second epitaxial layer 226 is a silicon carbide layer formed on the first epitaxial layer 126 by an epitaxial growth method. The second epitaxial layer 226 finally becomes a part of the high-concentration region 26b of the drift region 26.

Figure 9:
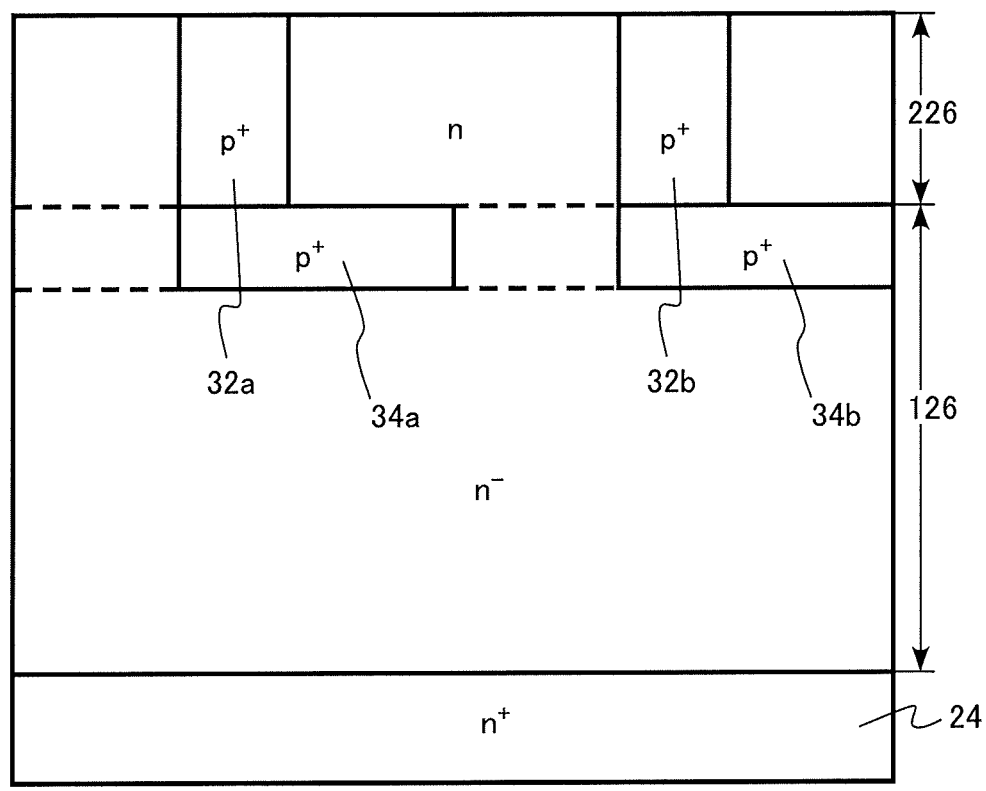
FIG. 9 is a schematic cross-sectional view showing an example of the method of manufacturing the semiconductor device of the first embodiment.

Next, a first upper electric field relaxation region 32a and a second upper electric field relaxation region 32b are formed in the second epitaxial layer 226 by an ion implantation method (FIG. 9).

Figure 10:
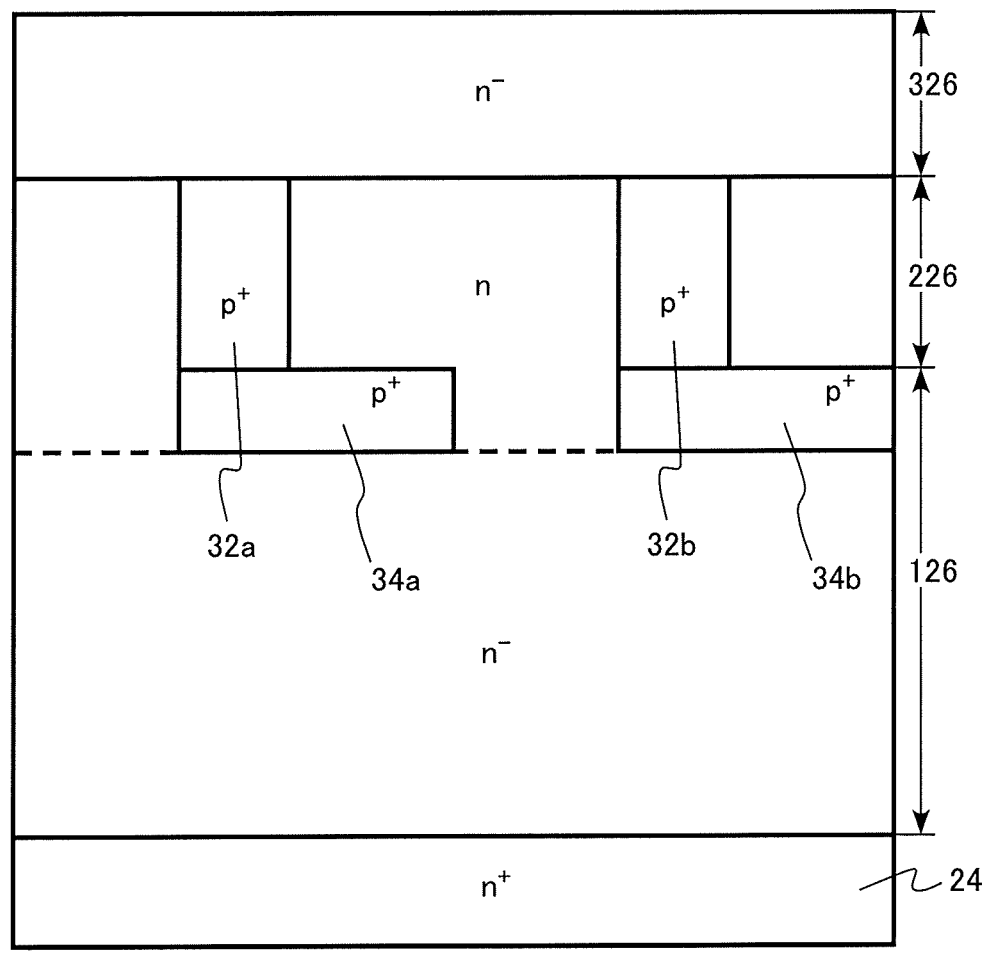
FIG. 10 is a schematic cross-sectional view showing an example of the method of manufacturing the semiconductor device of the first embodiment.

Next, an n-type third epitaxial layer 326 is formed on the front surface of the second epitaxial layer 226 (FIG. 10). The third epitaxial layer 326 is a silicon carbide layer formed on the second epitaxial layer 226 by an epitaxial growth method.

Figure 11:
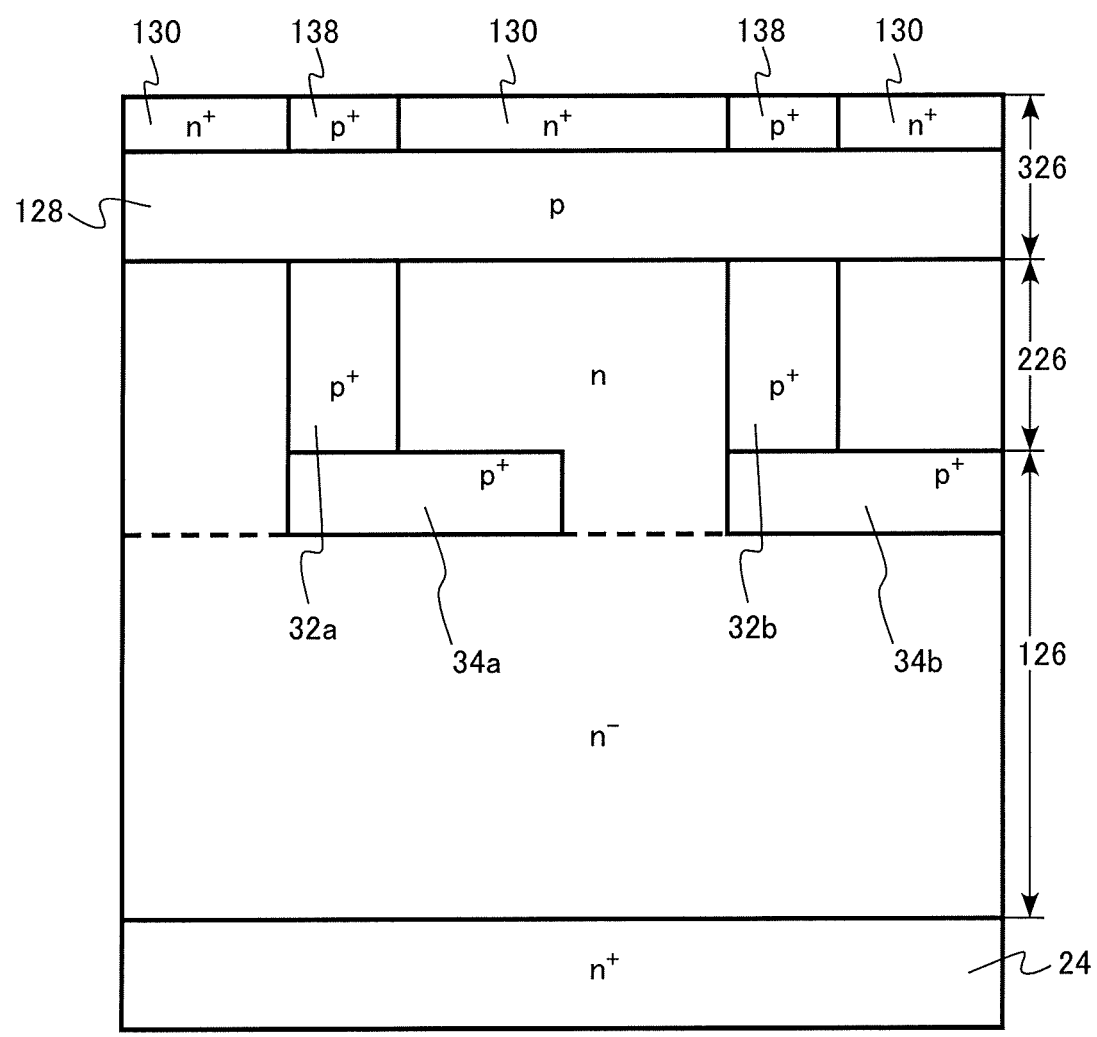
FIG. 11 is a schematic cross-sectional view showing an example of the method of manufacturing the semiconductor device of the first embodiment.

Next, a p-type region 128, an $n^+$-type region 130, and a $p^+$-type region 138 are formed in the third epitaxial layer 326 by an ion implantation method (FIG. 11). A part of the p-type region 128 finally becomes the first body region 28a and the second body region 28b. A part of the $n^+$-type region 130 finally becomes the first source region 30a and the second source region 30b. A part of the $p^+$-type region 138 finally becomes the first contact region 38a and the second contact region 38b.

Figure 12:
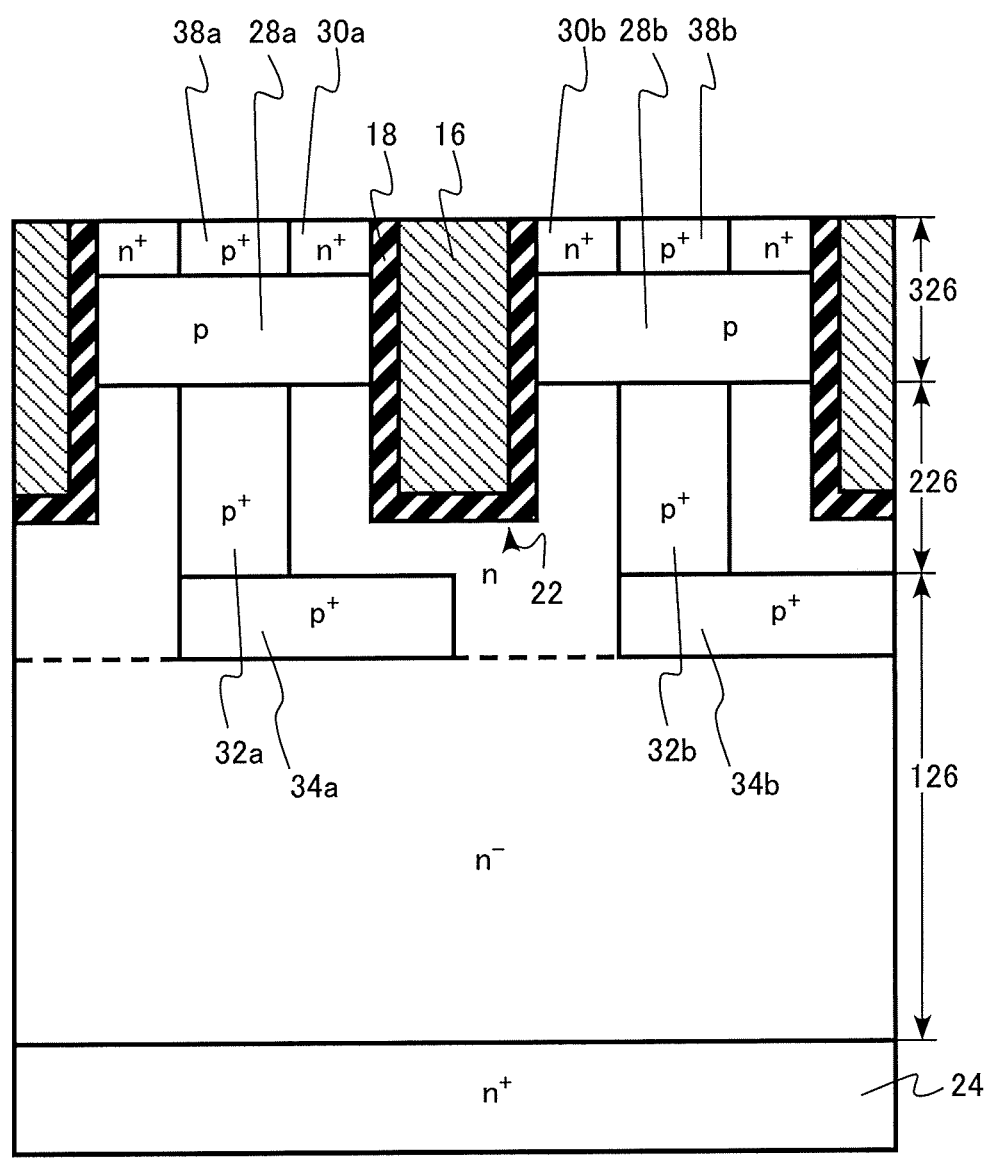
FIG. 12 is a schematic cross-sectional view showing an example of the method of manufacturing the semiconductor device of the first embodiment.

Next, trenches 22 are formed using a known process technique. Next, a gate insulating layer 18 and a gate electrode 16 are formed in the trench 22 by a known method (FIG. 12).

Subsequently, the interlayer insulating layer 20, the source electrode 12, and the drain electrode 14 are formed using a known process technique. By the above manufacturing method, the MOSFET 100 shown in FIG. 1 is manufactured.

Hereinafter, the function and effect of the semiconductor device of the first embodiment will be described.

In the trench gate type MOSFET, the on-resistance is reduced by increasing the channel density per unit area. However, when the MOSFET is turned off, the electric field concentrates on the gate insulating layer at the bottom of the trench, so that there is a problem that dielectric breakdown of the gate insulating layer is liable to occur.

In order to prevent dielectric breakdown of the gate insulating layer, it is conceivable to provide a p-type region in the drift region in the vicinity of the bottom of the trench to relax the electric field applied to the gate insulating layer. However, as the proportion of the p-type region occupied in the drift region increases, there arises a problem that the current path is constricted and the on-resistance increases.

The MOSFET 100 of the first embodiment includes, near the bottom of the trench 22, a $p^+$-type first upper electric field relaxation region 32a (a sixth silicon carbide region), a $p^+$-type second upper electric field relaxation region 32b (a seventh silicon carbide region), a $p^+$-type first lower electric field relaxation region 34a (an eighth silicon carbide region), and a $p^+$-type second lower electric field relaxation region 34b (a ninth silicon carbide region). As a result, the strength of the electric field applied to the gate insulating layer 18 when the MOSFET 100 is turned off is relaxed. Therefore, dielectric breakdown of the gate insulating layer 18 hardly occurs, and the reliability of the MOSFET 100 is improved.

The first lower electric field relaxation region 34a has a plurality of first regions 34ax extending toward the second lower electric field relaxation region 34b, interposing the drift region 26 between the first lower electric field relaxation region 34a and the second lower electric field relaxation region 34b, and being repeatedly disposed in the first direction in a plane parallel to the first direction and the second direction. Since the drift region 26 between the first region 34ax and the second lower electric field relaxation region 34b functions as a current path, the on-resistance of the MOSFET 100 is reduced. Details will be described below.

Figure 13:
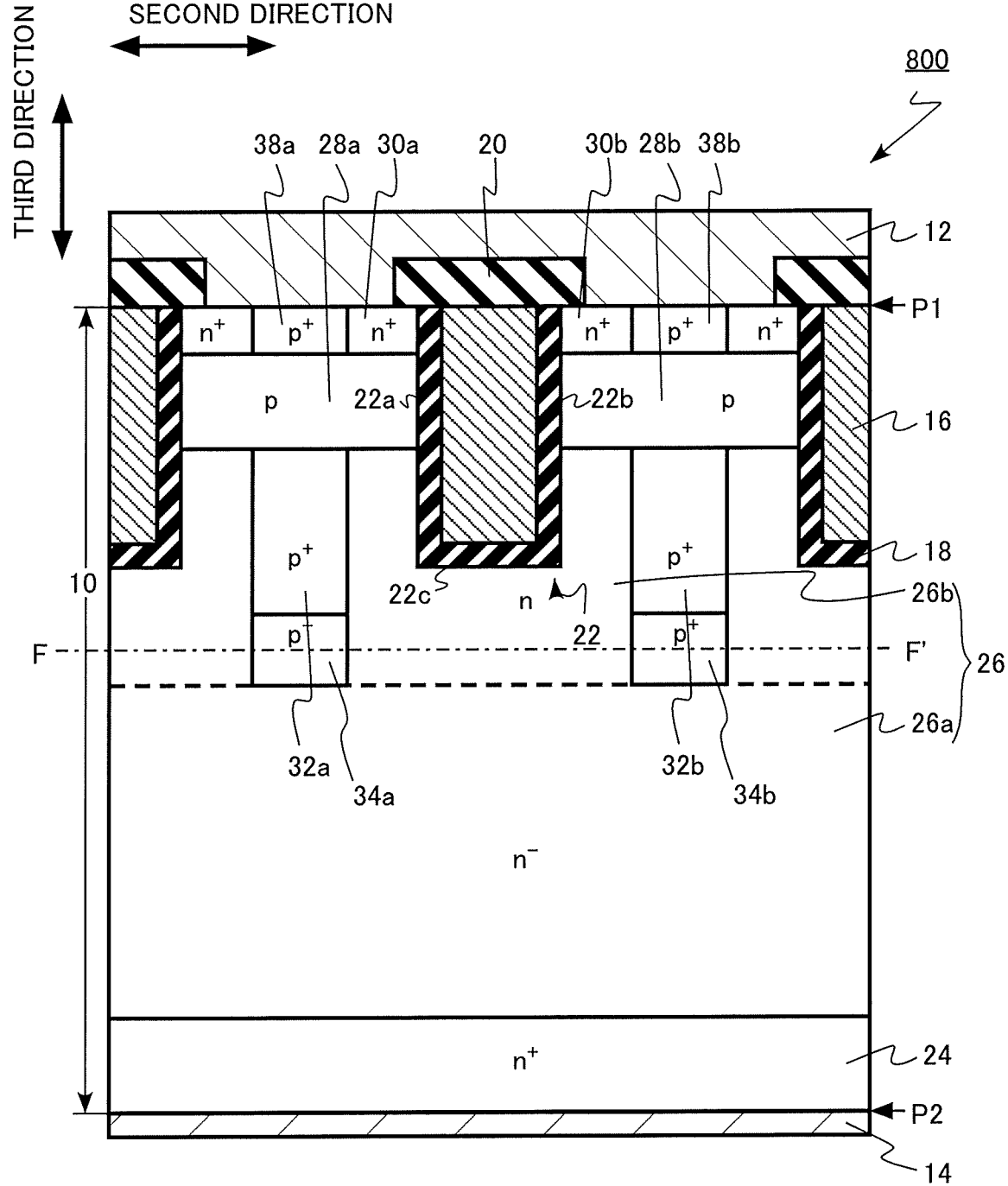
FIG. 13 is an explanatory diagram of a function and effect of the semiconductor device of the first embodiment.
Figure 14:
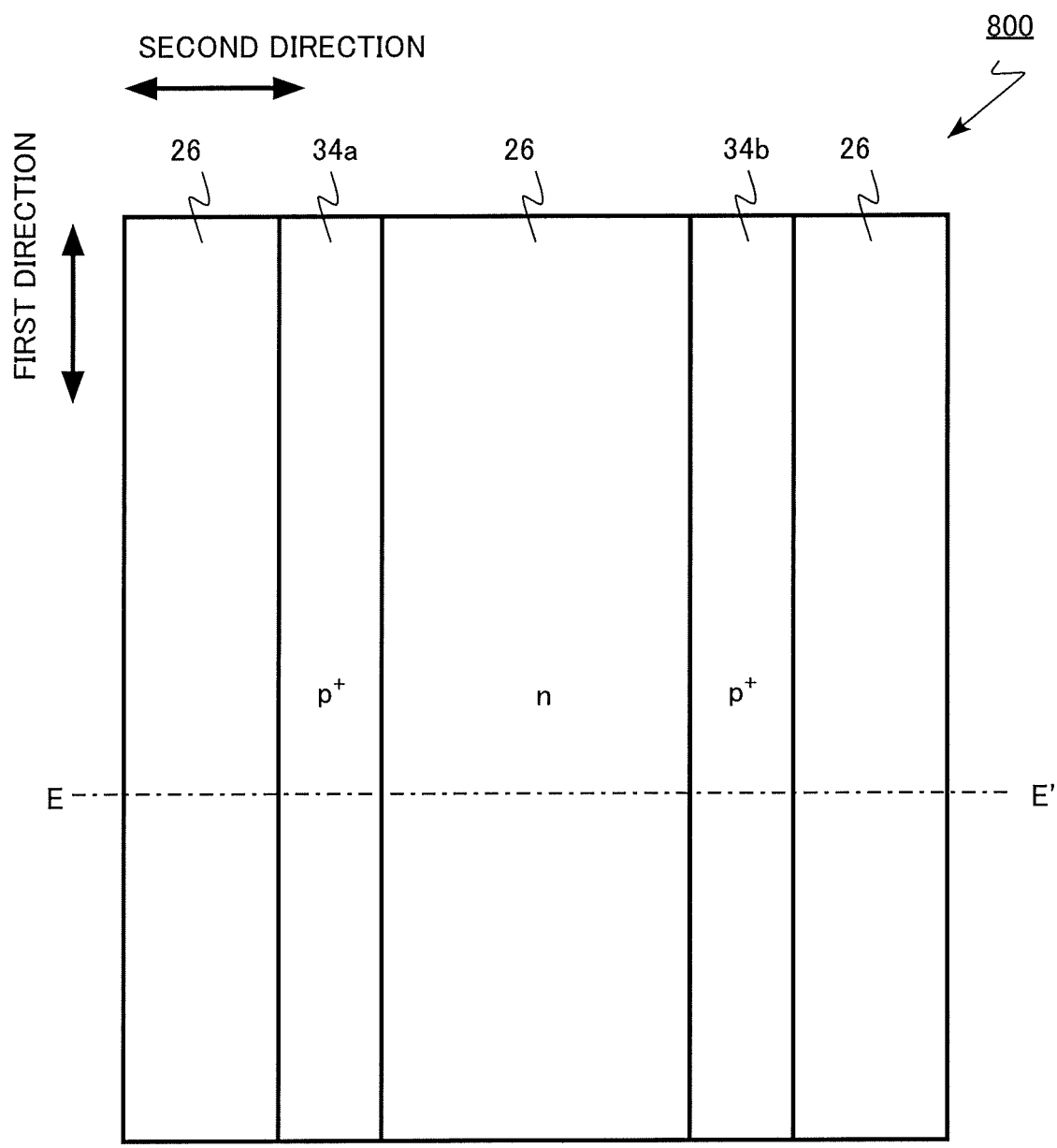
FIG. 14 is an explanatory diagram of a function and effect of the semiconductor device of the first embodiment.

FIGS. 13 and 14 are explanatory diagrams of the function and effect of the semiconductor device of the first embodiment. FIGS. 13 and 14 are schematic cross-sectional views of the semiconductor device of a first comparative example. FIG. 14 is a cross-sectional view taken along line FF' of FIG. 13. FIG. 14 is a cross section parallel to the first direction and the second direction. FIG. 14 is a cross section parallel to the first plane P1. FIG. 13 is a cross-sectional view taken along line EE' of FIG. 14.

The semiconductor device of the first comparative example is a trench gate type vertical MOSFET 800. The MOSFET 800 is different from the MOSFET 100 of the first embodiment in that the first lower electric field relaxation region 34a does not have the first region 34ax.

Figure 15:
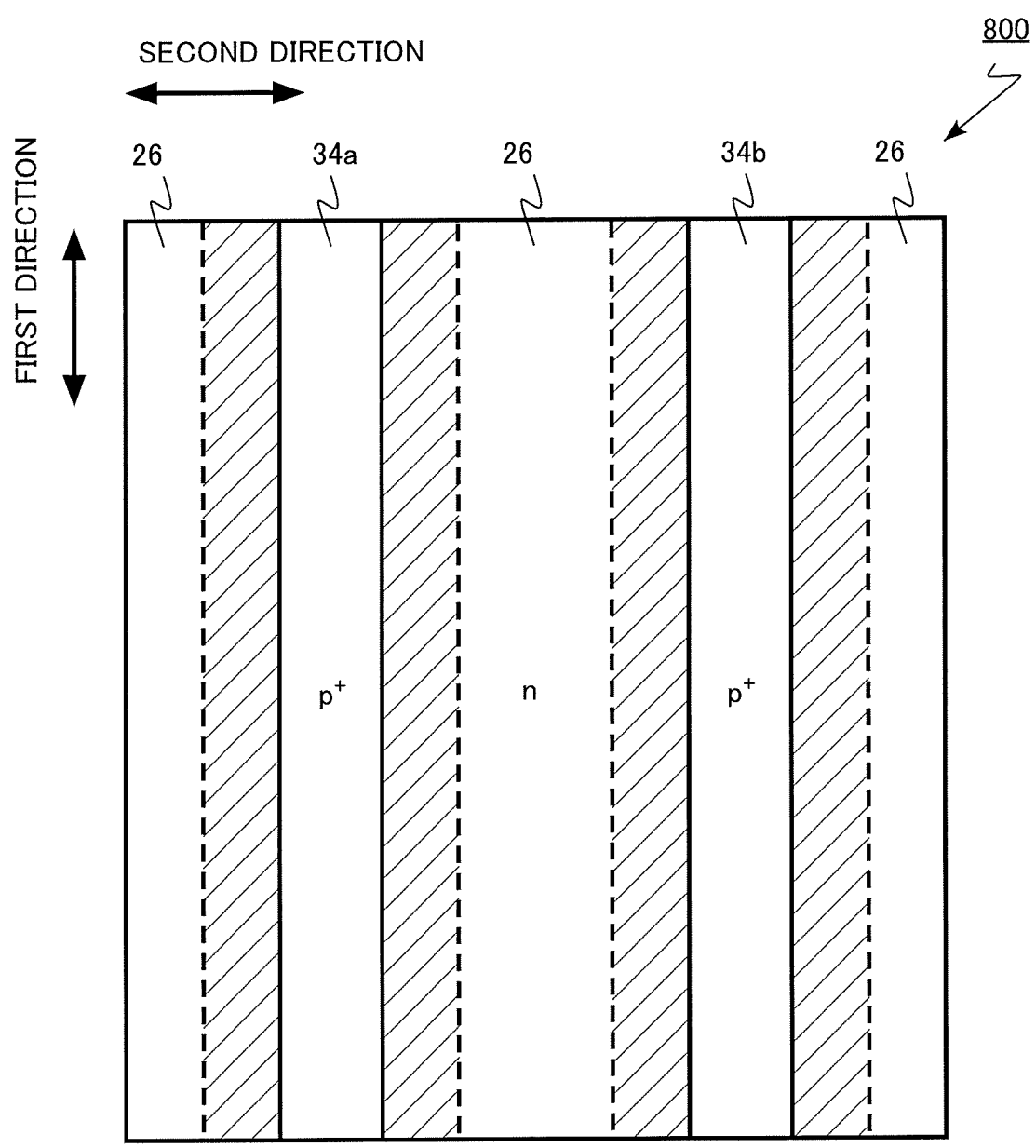
FIG. 15 is an explanatory diagram of a function and effect of the semiconductor device of the first embodiment.

FIG. 15 is an explanatory diagram of the function and effect of the semiconductor device of the first embodiment. FIG. 15 is a diagram schematically showing the extension of a depletion layer in the FF' cross section (corresponding to FIG. 14) of the MOSFET 800 of the first comparative example. The hatched portion schematically shows a depletion layer extending to the drift region 26 when the MOSFET 800 is turned off.

As shown in FIG. 15, since the depletion layer extends from the first lower electric field relaxation region 34a and the second lower electric field relaxation region 34b to the drift region 26, the strength of the electric field applied to the gate insulating layer 18 at the bottom of the trench 22 is relaxed. From the viewpoint of further relaxing the electric field strength, it is preferable to further widen the region of the depletion layer extending to the drift region 26.

Figure 16:
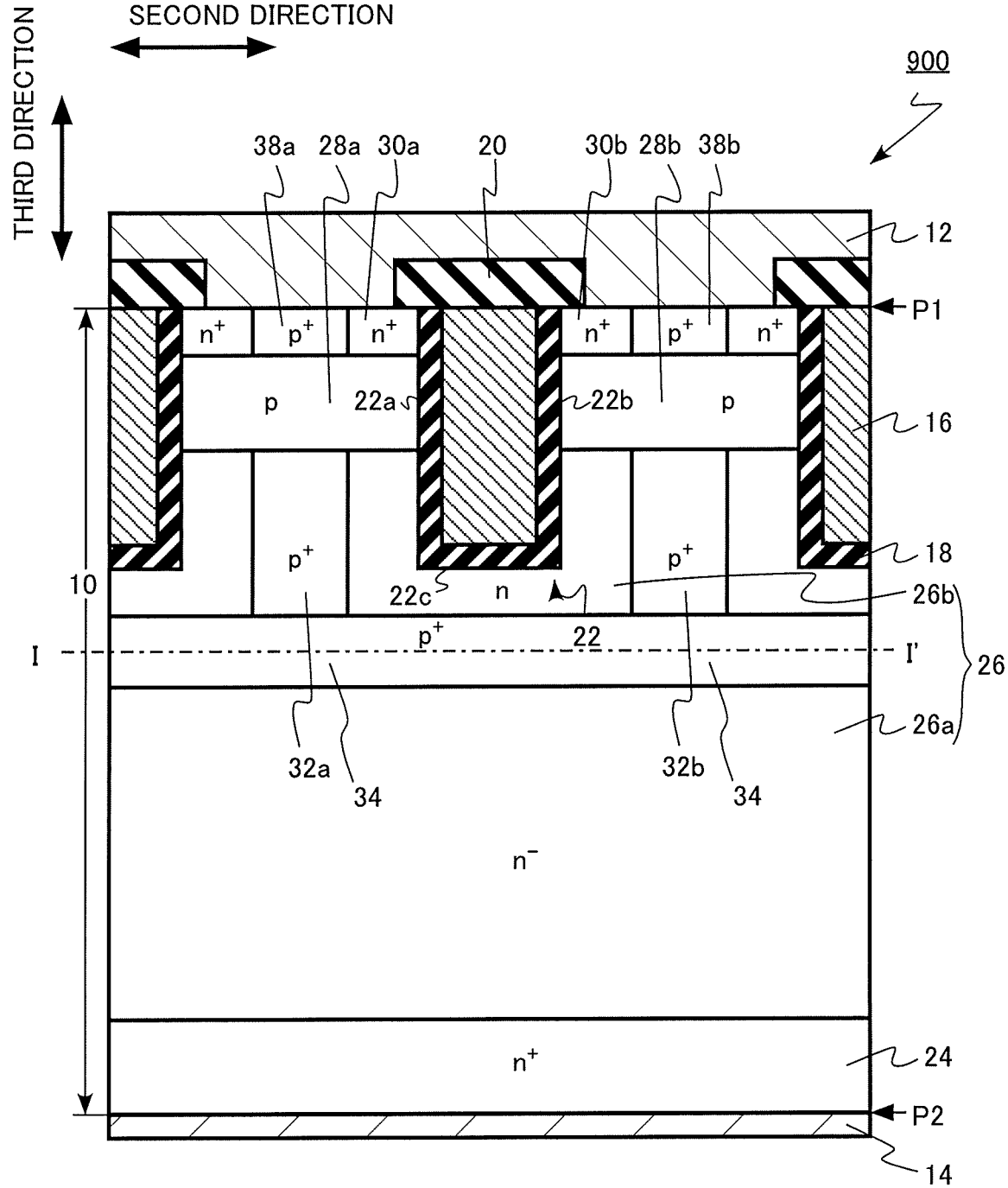
FIG. 16 is an explanatory diagram of a function and effect of the semiconductor device of the first embodiment.
Figure 17:
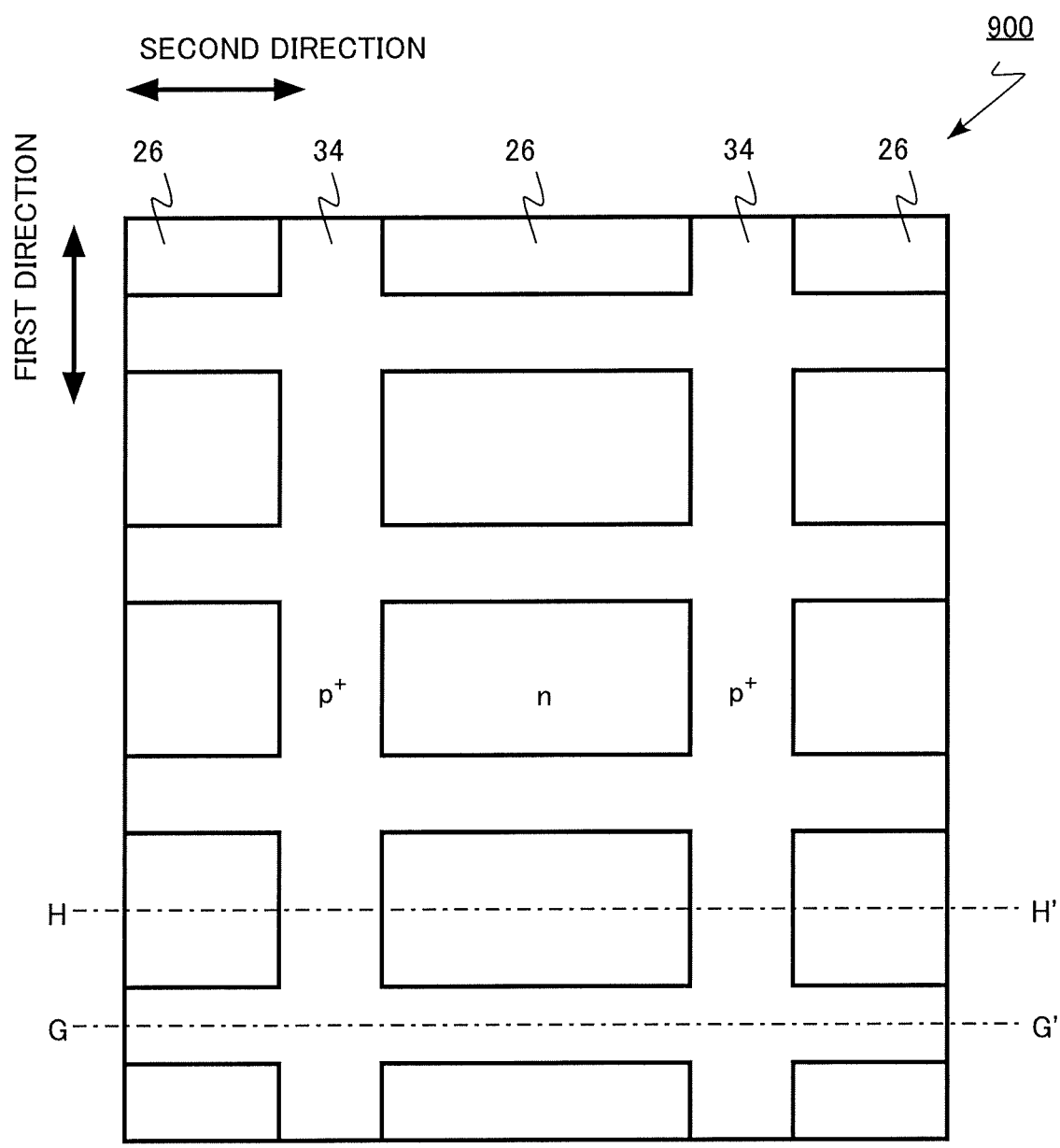
FIG. 17 is an explanatory diagram of a function and effect of the semiconductor device of the first embodiment.
Figure 18:
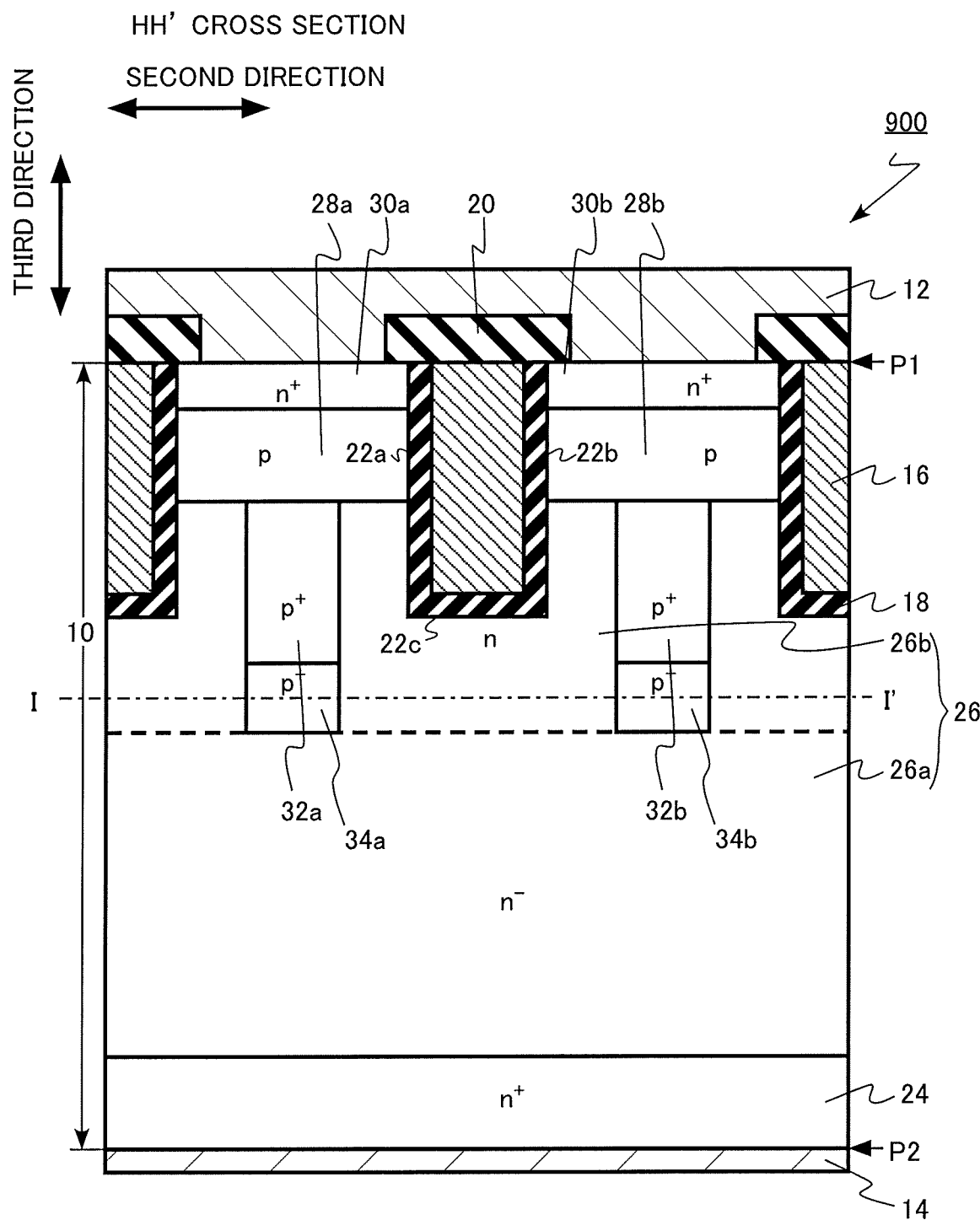
FIG. 18 is an explanatory diagram of a function and effect of the semiconductor device of the first embodiment.

FIGS. 16, 17, and 18 are explanatory diagrams of the function and effect of the semiconductor device of the first embodiment. FIGS. 16, 17, and 18 are schematic cross-sectional views of the semiconductor device of a second comparative example. FIG. 17 is a cross section taken along line II' of FIG. 16. FIG. 17 is a cross section parallel to the first direction and the second direction. FIG. 17 is a cross section parallel to the first plane P1. FIG. 16 is a cross section taken along line GG' of FIG. 17. FIG. 18 is a cross section taken along line HH' of FIG. 17.

The semiconductor device of the second comparative example is a trench gate type vertical MOSFET 900. As shown in FIG. 17, the MOSFET 900 is different from the first comparative example in that the lower electric field relaxation region 34 has a lattice shape. The lower electric field relaxation region 34 has a portion extending in the second direction, which is different from the first comparative example.

Figure 19:
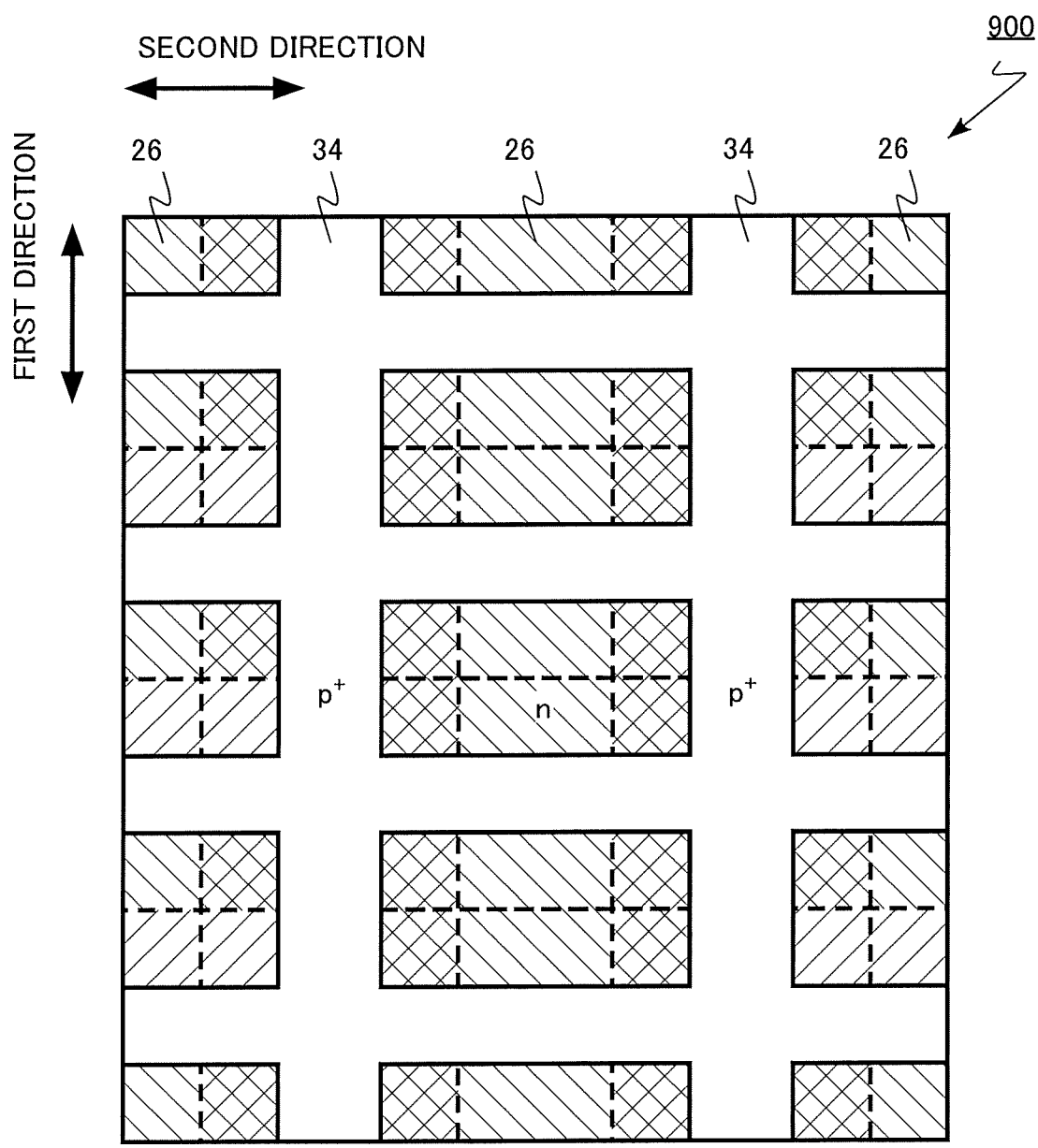
FIG. 19 is an explanatory diagram of a function and effect of the semiconductor device of the first embodiment.

FIG. 19 is an explanatory diagram of the function and effect of the semiconductor device of the first embodiment. FIG. 19 is a diagram schematically showing the extension of the depletion layer in the II' cross section (corresponding to FIG. 17) of the MOSFET 900 of the second comparative example. A hatched portion schematically shows a depletion layer in which the drift region 26 extends when the MOSFET 900 is turned off.

As shown in FIG. 19, since the depletion layer extends from the grid-like lower electric field relaxation region 34 to the drift region 26, the strength of electric field applied to the gate insulating layer 18 at the bottom of the trench 22 is relaxed. Since the depletion layer extends also from the portion extending in the second direction of the lower electric field relaxation region 34, the region of the depletion layer extending to the drift region 26 further spreads as compared with the first comparative example. Therefore, as compared with the first comparative example, the strength of electric field applied to the gate insulating layer 18 at the bottom of the trench 22 is further relaxed. Therefore, dielectric breakdown of the gate insulating layer 18 hardly occurs, and the reliability of the MOSFET 900 is improved.

However, in the second comparative example, the existence of a portion extending in the second direction of the lower electric field relaxation region 34 increases the proportion of the p-type region occupied in the drift region 26, as compared with the first comparative example. Therefore, as compared with the first comparative example, the current path is constricted and the on-resistance is increased.

In the MOSFET 100 of the first embodiment, as shown in FIG. 3, the first lower electric field relaxation region 34*a* has a plurality of first regions 34*ax* repeatedly disposed in the first direction. The first region 34*ax* interposes the drift region 26 between the second lower electric field relaxation region 34*b* and the first region 34*ax*. In addition, the second lower electric field relaxation region 34*b* has a plurality of second regions 34*bx* repeatedly disposed in the first direction. Then, the drift region 26 is interposed between the second region 34*bx* and the first lower electric field relaxation region 34*a*.

Therefore, in the first embodiment, the proportion of the p-type region occupied in the drift region 26 becomes small, as compared with the case of the second comparative example. Therefore, as compared with the second comparative example, the current path widens and the on-resistance decreases.

Figure 20:
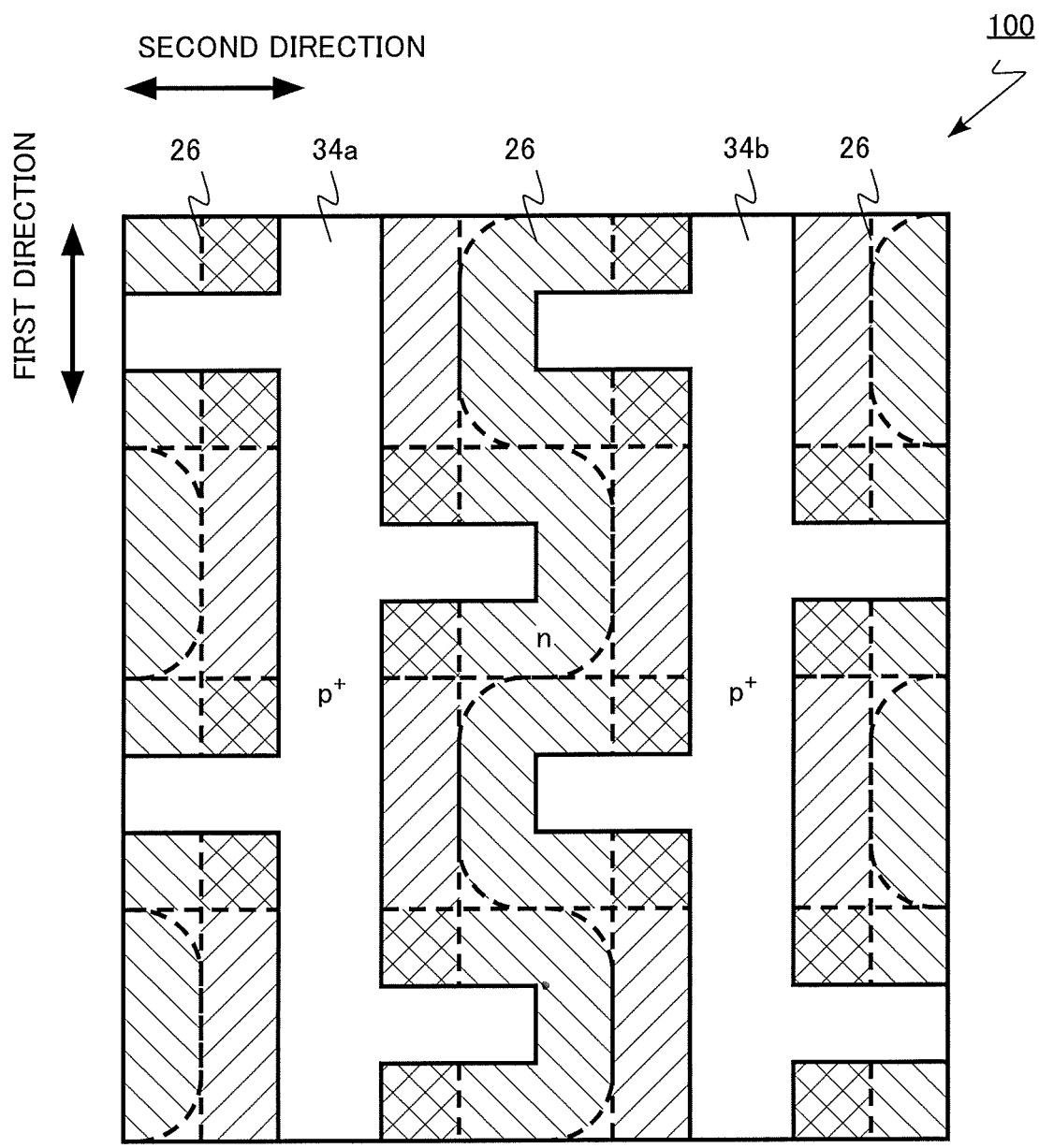
FIG. 20 is an explanatory diagram of a function and effect of the semiconductor device of the first embodiment.

FIG. 20 is an explanatory diagram of the function and effect of the semiconductor device of the first embodiment. FIG. 20 is a diagram schematically showing the extension of the depletion layer in the DD' cross section (corresponding to FIG. 3) of the MOSFET 100 of the first embodiment. A hatched portion schematically shows a depletion layer in which the drift region 26 extends when the MOSFET 100 is turned off.

As shown in FIG. 20, since the depletion layer extends from the first lower electric field relaxation region 34*a* and the second lower electric field relaxation region 34*b* to the drift region 26, the strength of electric field applied to the gate insulating layer 18 at the bottom of the trench 22 is relaxed. Since the depletion layer extends also from the first region 34*ax* and the second region 34*bx*, the region of the depletion layer extending to the drift region 26 further spreads as compared with the first comparative example. Therefore, as compared with the first comparative example, the strength of electric field applied to the gate insulating layer 18 at the bottom of the trench 22 is further relaxed. Further, a region of the depletion layer which is substantially equal to that of the second comparative example extends to the drift region 26. Therefore, the dielectric breakdown of the gate insulating layer 18 hardly occurs, and the reliability of the MOSFET 100 is improved similarly to the MOSFET 900.

It is preferable from the viewpoint of spreading the region of the depletion layer that the distance (d4 in FIG. 1) between the first region 34*ax* and the second lower electric field relaxation region 34*b* is not more than half the distance (d5 in FIG. 1) between the first upper electric field relaxation region 32*a* and the second upper electric field relaxation region 32*b*. Similarly, it is preferable from the viewpoint of spreading the region of the depletion layer that the distance between the second region 34*bx* and the first lower electric field relaxation region 34*a* is not more than half the distance (d5 in FIG. 1) between the first upper electric field relaxation region 32*a* and the second upper electric field relaxation region 32*b*.

On the other hand, it is preferable from the viewpoint of widening the current path and reducing the on-resistance that the distance (d4 in FIG. 1) between the first region 34*ax* and the second lower electric field relaxation region 34*b* is not less than one-quarter of the distance (d5 in FIG. 1) between the first upper electric field relaxation region 32*a* and the second upper electric field relaxation region 32*b*. Similarly, it is preferable from the viewpoint of widening the current path and reducing the on-resistance that the distance between the second region 34*bx* and the first lower electric field relaxation region 34*a* is not less than one-quarter of the distance (d5 in FIG. 1) between the first upper electric field relaxation region 32*a* and the second upper electric field relaxation region 32*b*.

It is preferable from the viewpoint of widening the current path and reducing the on-resistance that the drift region 26 is interposed between the first region 34*ax* and the bottom plane 22*c* of the trench 22. Similarly, it is preferable from the viewpoint of widening the current path and reducing the on-resistance that the drift region 26 is interposed between the second region 34*bx* and the bottom plane 22*c* of the trench 22.

It is preferable that the first regions 34*ax* and the second regions 34*bx* are alternately disposed in the first direction as shown in FIG. 3. It is preferable that the first regions 34*ax* and the second regions 34*bx* are alternately disposed one by one in the first direction. When they are disposed in this manner, the concentrated portion of the on-current is dispersed, and the heat generating portion in the drift region 26 is dispersed. Therefore, defects caused by heat generation of the MOSFET 100 can be reduced.

The p-type impurity concentration of the first lower electric field relaxation region 34*a* and the second lower electric field relaxation region 34b is, for example, higher than the p-type impurity concentration of the first body region 28a and the second body region 28b, which is preferable from the viewpoint of spreading the region of the depletion layer.

As shown in FIG. 1, the drift region 26 preferably has a low-concentration region 26a and a high-concentration region 26b. The n-type impurity concentration of the drift region 26 between the first upper electric field relaxation region 32a and the second upper electric field relaxation region 32b and the drift region 26 between the first lower electric field relaxation region 34a and the second lower electric field relaxation region 34b is increased, and whereby the on-resistance of the MOSFET 100 is reduced.

Figure 21:
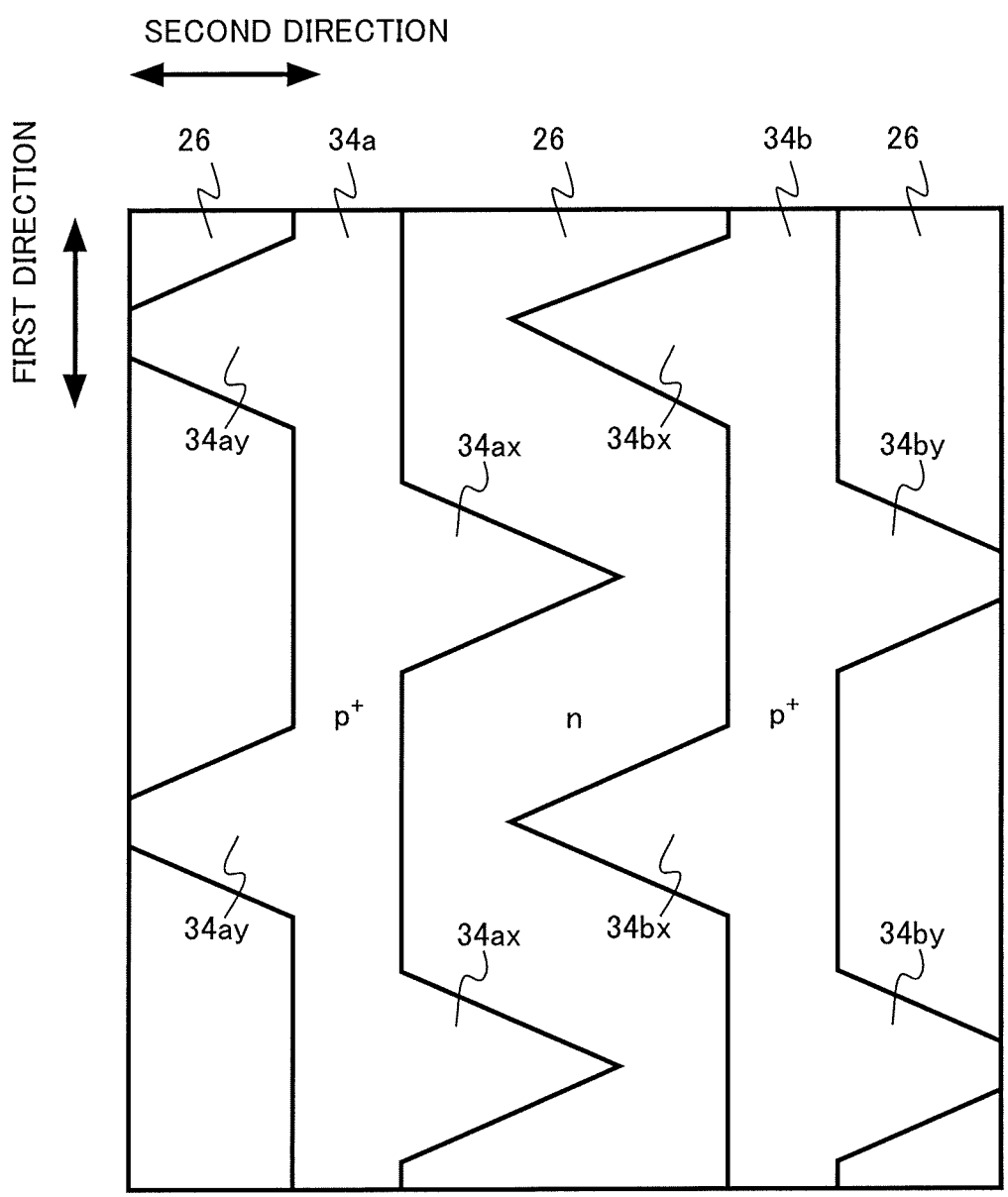
FIG. 21 is a schematic cross-sectional view of a first modification of the semiconductor device of the first embodiment.

FIG. 21 is a schematic cross-sectional view of a first modification of the semiconductor device of the first embodiment. FIG. 21 is a cross section corresponding to FIG. 3 of the semiconductor device of the first embodiment.

In the MOSFET of the first modification, the shapes of the first region 34ax, the second region 34bx, the third region 34ay, and the fourth region 34by are triangular, which is different from the MOSFET 100 of the first embodiment.

Figure 22:
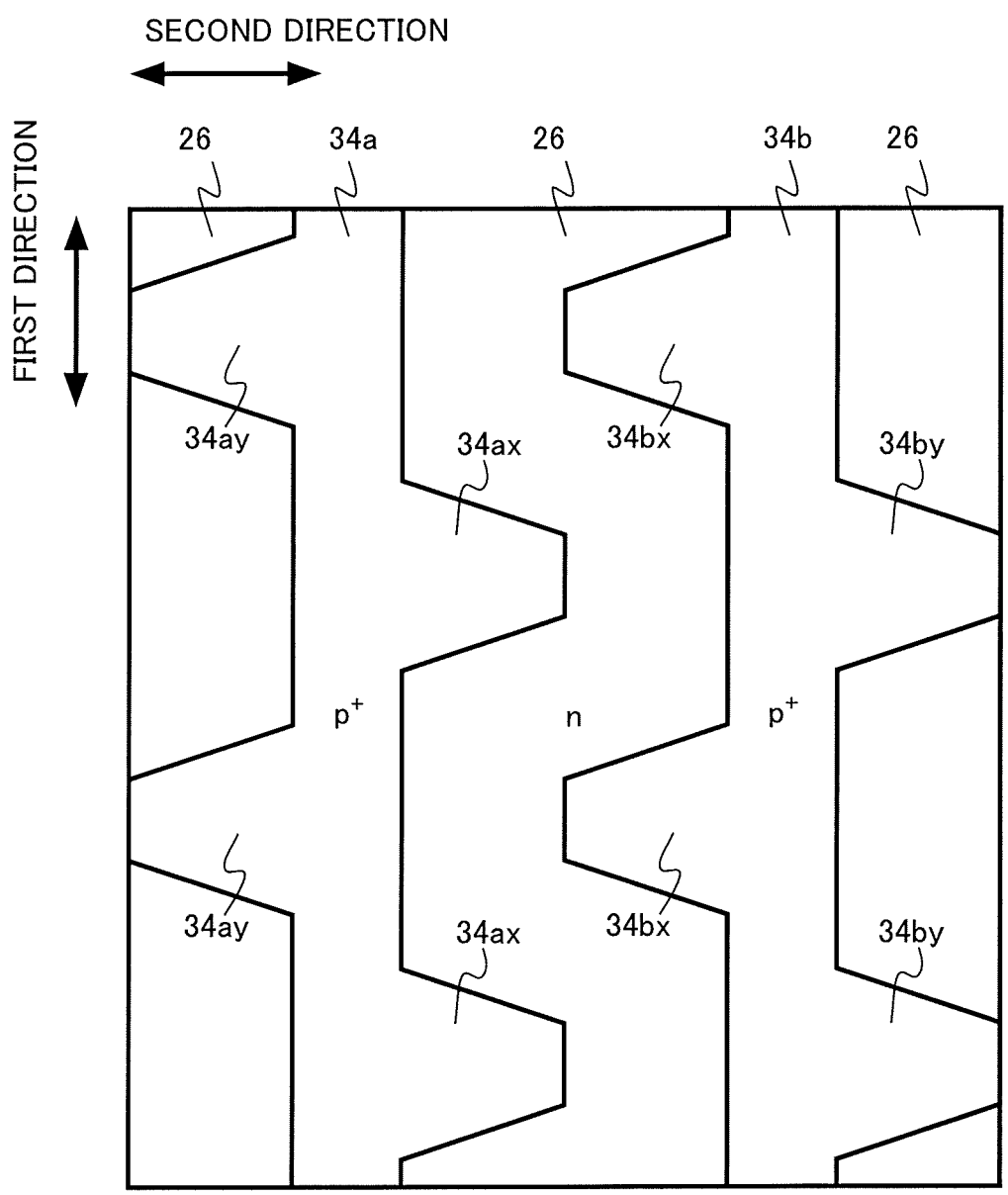
FIG. 22 is a schematic cross-sectional view of a second modification of the semiconductor device of the first embodiment.

FIG. 22 is a schematic cross-sectional view of a second modification of the semiconductor device of the first embodiment. FIG. 22 is a cross section corresponding to FIG. 3 of the semiconductor device of the first embodiment.

In the MOSFET of the second modification, the shapes of the first region 34ax, the second region 34bx, the third region 34ay, and the fourth region 34by are trapezoidal, which is different from the MOSFET 100 of the first embodiment.

According to the MOSFET of the first modification and the MOSFET of the second modification, the same function and effect as those of the MOSFET 100 of the first embodiment can be obtained.

As described above, according to the MOSFET 100 of the first embodiment and the MOSFET of the modification, the on-resistance is reduced. In addition, the breakdown voltage of the gate insulating layer 18 is improved, and the reliability is improved.

Second Embodiment

In the semiconductor device of the second embodiment, the first region has a first portion and a second portion located between the first portion and the ninth silicon carbide region, and the width of the second portion in the first direction is larger than the width of the first portion in the first direction, which is different from the first embodiment. Hereinafter, a part of the description overlapping with the first embodiment will be omitted.

Figure 23:
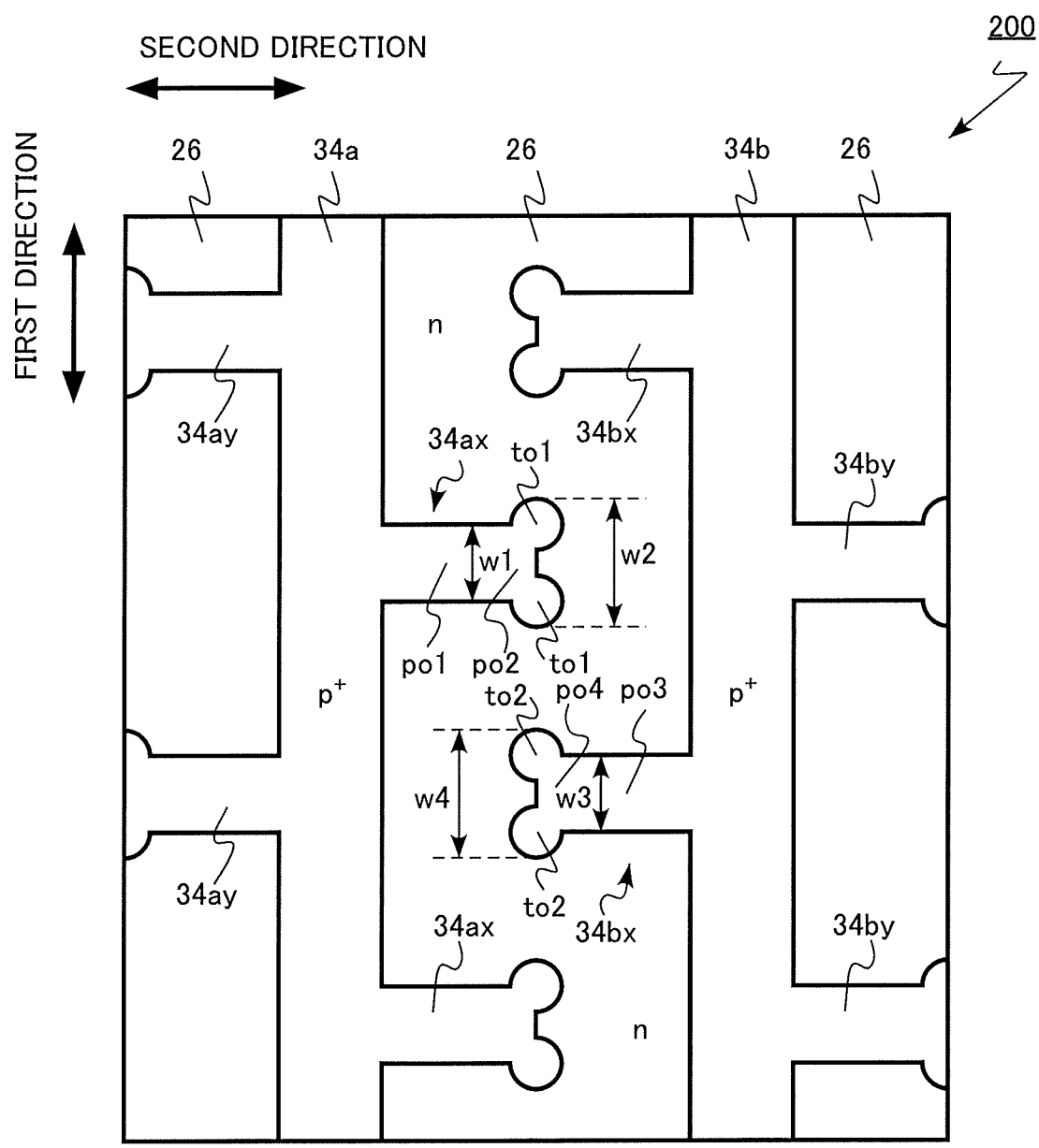
FIG. 23 is a schematic cross-sectional view of a semiconductor device of a second embodiment.

FIG. 23 is a schematic cross-sectional view of the semiconductor device of the second embodiment. FIG. 23 is a cross section corresponding to FIG. 3 of the semiconductor device of the first embodiment. The semiconductor device of the second embodiment is a trench gate type vertical MOSFET 200.

The first lower electric field relaxation region 34a has a plurality of first regions 34ax and a plurality of third regions 34ay. The first region 34ax extends toward the second lower electric field relaxation region 34b. The first region 34ax extends in the second direction.

The first region 34ax has a first portion po1 and a second portion po2. The second portion po2 is located between the first portion po1 and the second lower electric field relaxation region 34b. The width (w2 in FIG. 23) of the second portion po2 in the first direction is larger than the width (w1 in FIG. 23) of the first portion po1 in the first direction.

The second portion po2 includes two protrusions to1 protruding obliquely with respect to the second direction. The protrusion to1 is, for example, circular. For example, the protrusion to1 may be a polygon such as a rectangle.

The second lower electric field relaxation region 34b has a plurality of second regions 34bx and a plurality of fourth regions 34by. The second region 34bx extends toward the first lower electric field relaxation region 34a. The second region 34bx extends in the second direction.

The second region 34bx has a third portion po3 and a fourth portion po4. The fourth portion po4 is located between the third portion po3 and the first lower electric field relaxation region 34a. The width (w4 in FIG. 23) of the fourth portion po4 in the first direction is larger than the width (w3 in FIG. 23) of the third portion po3 in the first direction.

The fourth portion po4 includes two protrusions to2 protruding obliquely with respect to the second direction. The protrusion to2 is, for example, circular. For example, the protrusion to2 may be a polygon such as a rectangle.

Figure 24:
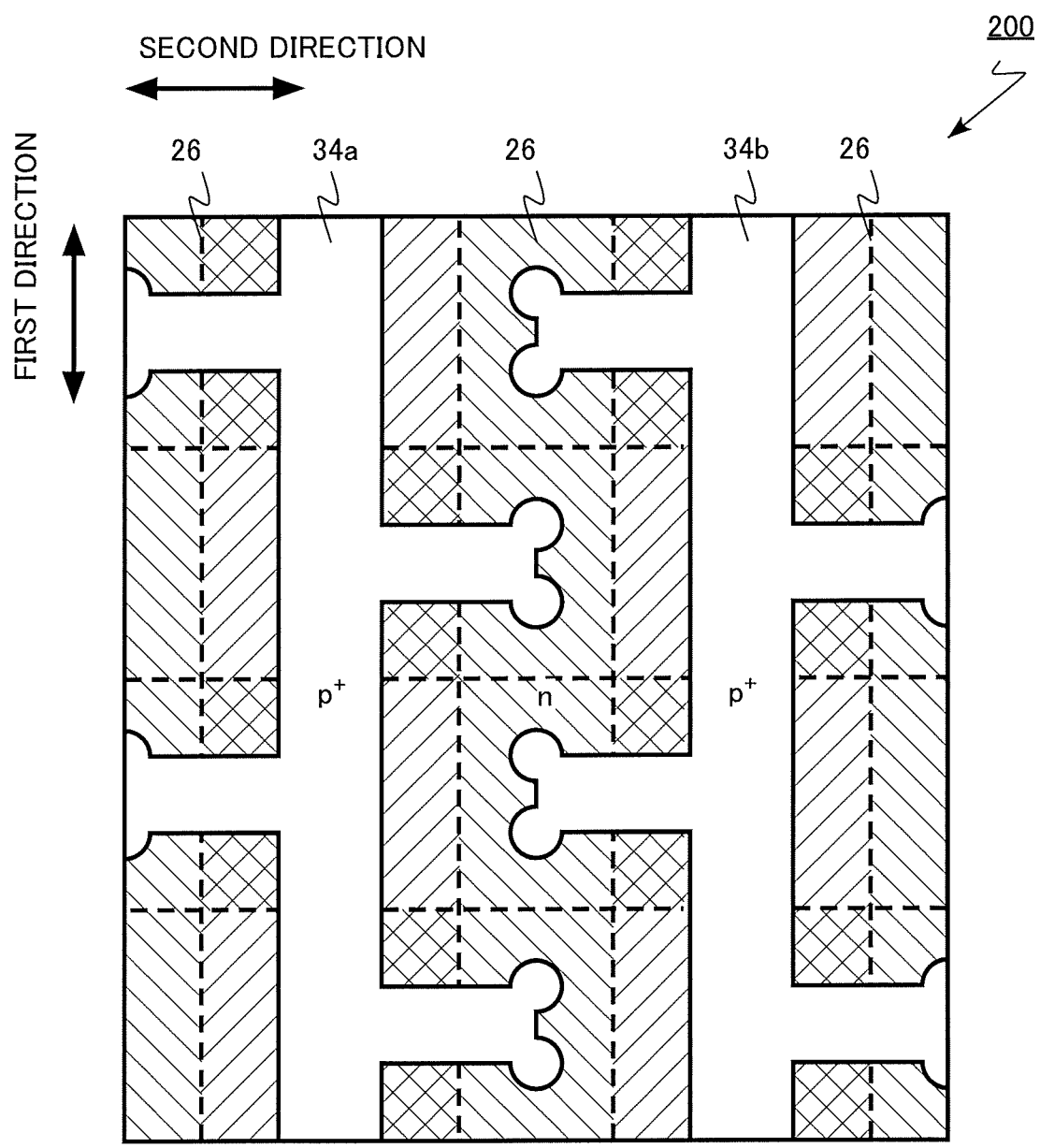
FIG. 24 is an explanatory diagram of a function and effect of the semiconductor device of the second embodiment.

FIG. 24 is an explanatory diagram of the function and effect of the semiconductor device of the second embodiment. FIG. 24 is a diagram schematically showing the extension of the depletion layer of the MOSFET 200 of the second embodiment. The hatched portion schematically shows a depletion layer in which the drift region 26 extends when the MOSFET 200 is turned off.

As shown in FIG. 24, since the depletion layer extends from the first lower electric field relaxation region 34a and the second lower electric field relaxation region 34b to the drift region 26, the strength of electric field applied to the gate insulating layer 18 at the bottom of the trench 22 is relaxed. Since the first lower electric field relaxation region 34a includes the protrusion to1 and the second lower electric field relaxation region 34b includes the protrusion to2, the region of the depletion layer extending to the drift region 26 further spreads, as compared with the first embodiment. Therefore, as compared with the first embodiment, the strength of electric field applied to the gate insulating layer 18 at the bottom of the trench 22 is further relaxed.

Figure 25:
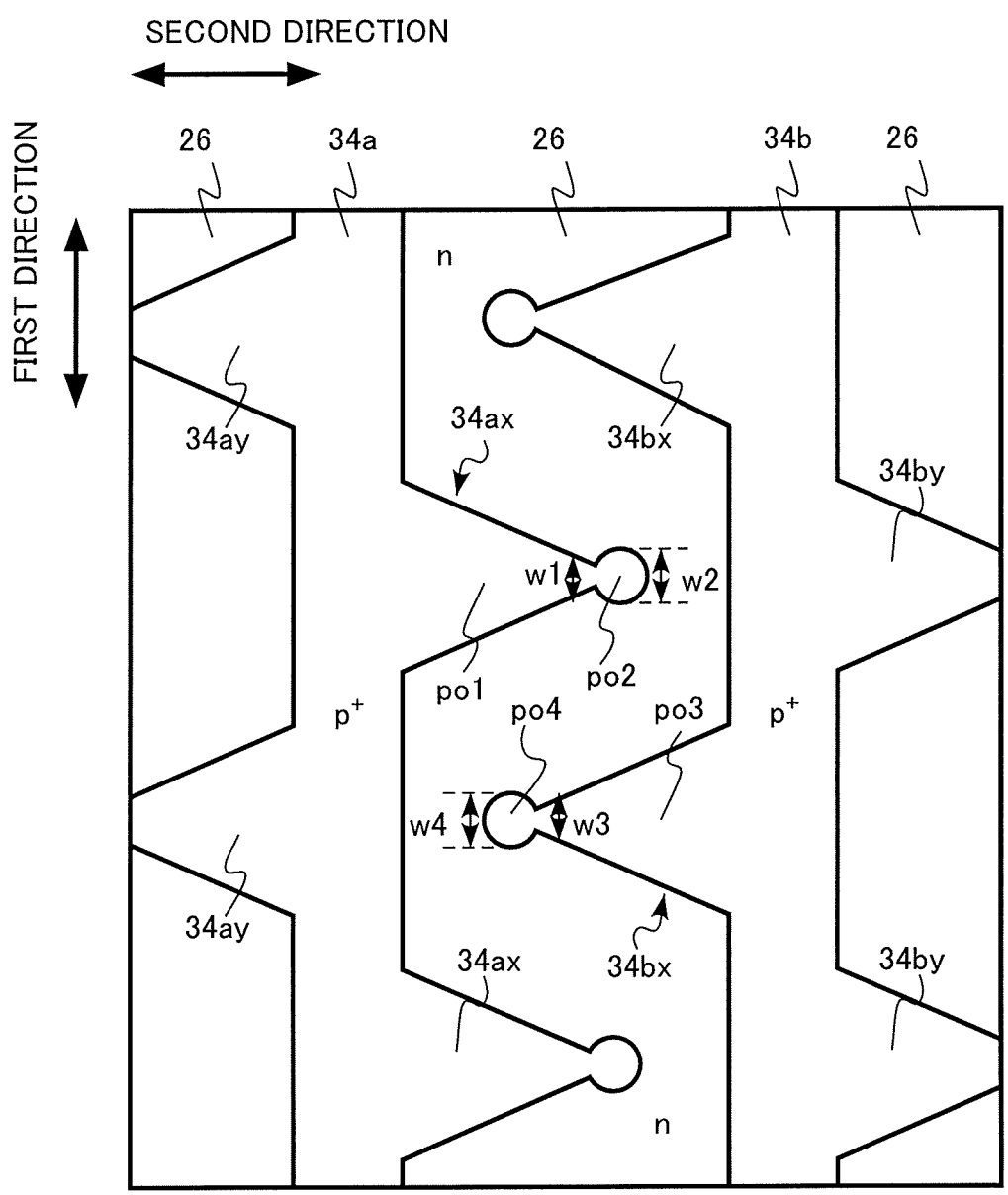
FIG. 25 is a schematic cross-sectional view of a first modification of the semiconductor device of the second embodiment.

FIG. 25 is a schematic cross-sectional view of a first modification of the semiconductor device of the second embodiment. FIG. 25 is a cross section corresponding to FIG. 23 of the semiconductor device of the second embodiment.

The MOSFET of the first modification is different from the MOSFET 200 of the second embodiment in that the shapes of the first portion po1 and the third portion po3 are trapezoidal, the second portion po2 does not have the protrusion to1, and the fourth portion po4 does not have the protrusion to2.

Figure 26:
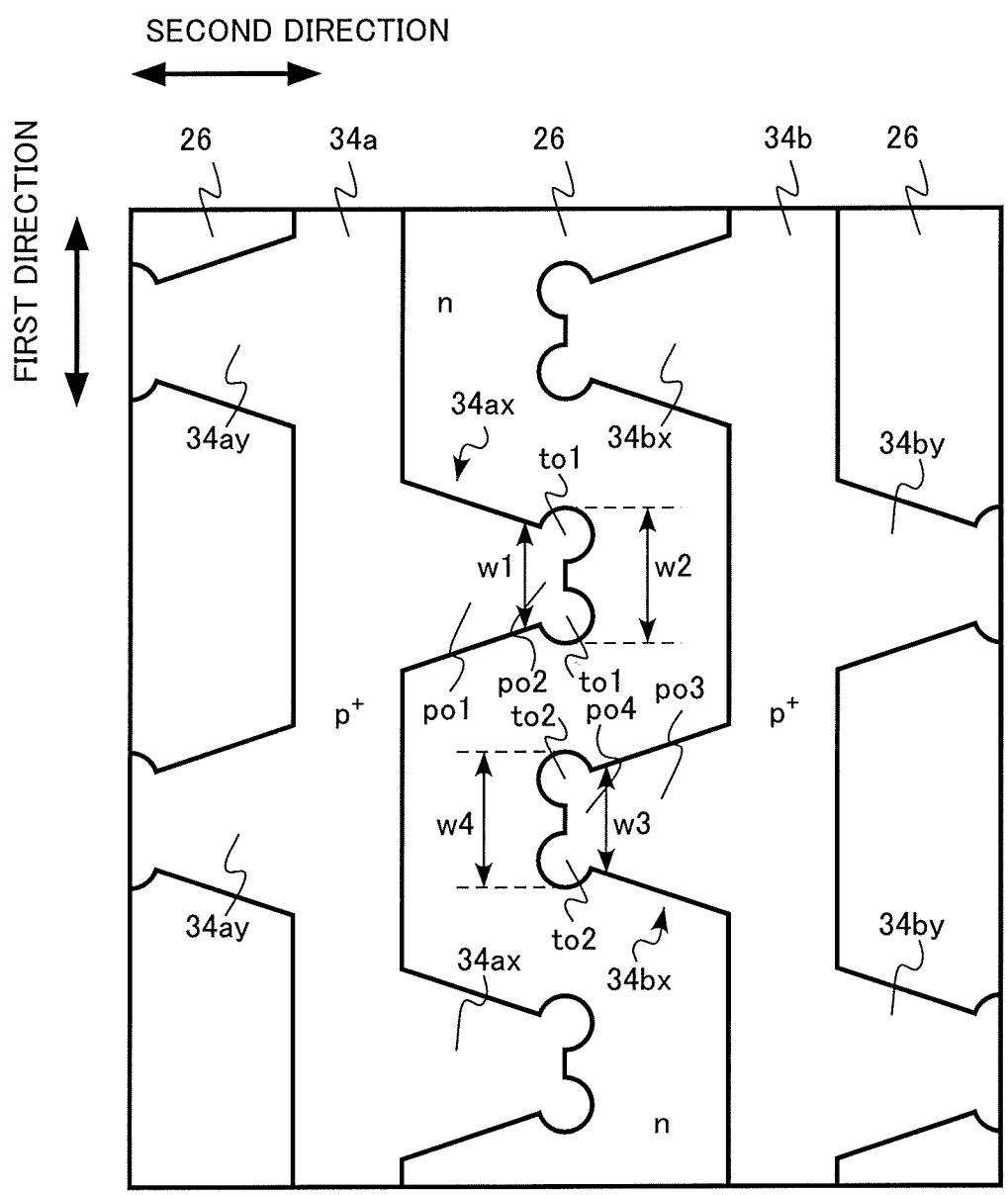
FIG. 26 is a schematic cross-sectional view of a second modification of the semiconductor device of the second embodiment.

FIG. 26 is a schematic cross-sectional view of a second modification of the semiconductor device of the second embodiment. FIG. 26 is a cross section corresponding to FIG. 23 of the semiconductor device of the second embodiment.

The MOSFET of the second modification is different from the MOSFET 200 of the second embodiment in that the shapes of the first portion po1 and the third portion po3 are trapezoidal.

According to the MOSFET of the first modification and the MOSFET of the second modification, the same function and effect as those of the MOSFET 200 of the second embodiment can be obtained.

As described above, according to the MOSFET 200 of the second embodiment and the MOSFET of the modification, the on-resistance is reduced as in the first embodiment. In addition, the breakdown voltage of the gate insulating layer 18 is further improved, and the reliability is further improved.

Third Embodiment

The semiconductor device of the third embodiment is different from the first embodiment in that the eighth silicon carbide region does not have the third region and the ninth silicon carbide region does not have the fourth region. Hereinafter, a part of the description overlapping with the first embodiment will be omitted.

Figure 27:
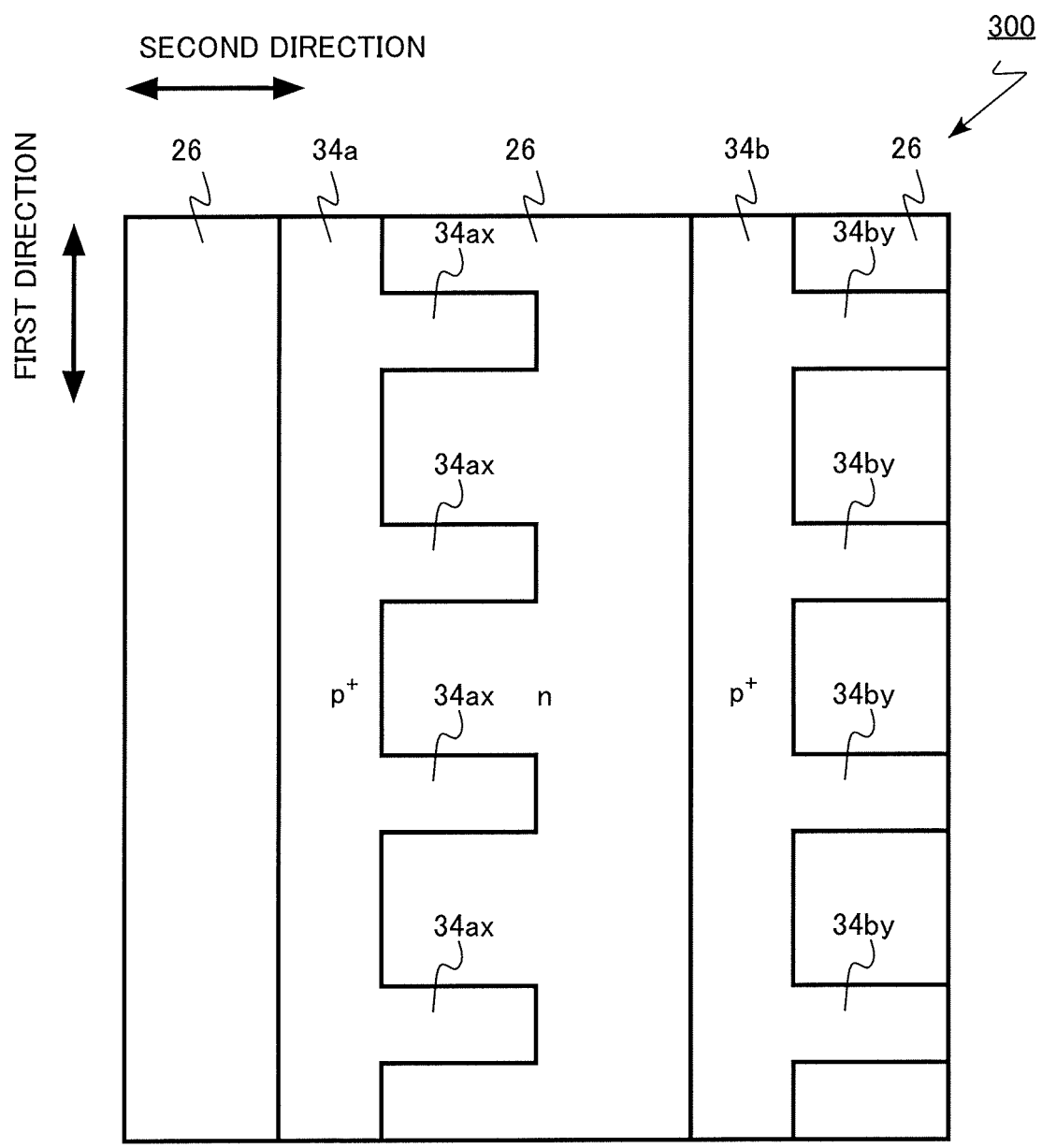
FIG. 27 is a schematic cross-sectional view of a semiconductor device of a third embodiment.

FIG. 27 is a schematic cross-sectional view of the semiconductor device of the third embodiment. FIG. 27 is a cross section corresponding to FIG. 3 of the semiconductor device of the first embodiment. The semiconductor device of the third embodiment is a trench gate type vertical MOSFET 300.

The first lower electric field relaxation region 34a has a plurality of first regions 34ax. The first region 34ax extends toward the second lower electric field relaxation region 34b. The first region 34ax extends in the second direction. The first region 34ax interposes the drift region 26 between the second lower electric field relaxation region 34b and the first region 34ax.

The first region 34ax is repeatedly disposed in the first direction in a plane parallel to the first plane P1 and the second plane P2. The drift region 26 is interposed between the two first regions 34ax.

The second lower electric field relaxation region 34b has a plurality of fourth regions 34by. The fourth region 34by extends in the second direction. The fourth region 34by extends in the same direction as the first region 34ax. The fourth region 34by is repeatedly disposed in the first direction in a plane parallel to the first plane P1 and the second plane P2. The drift region 26 is interposed between the two fourth regions 34by.

Figure 28:
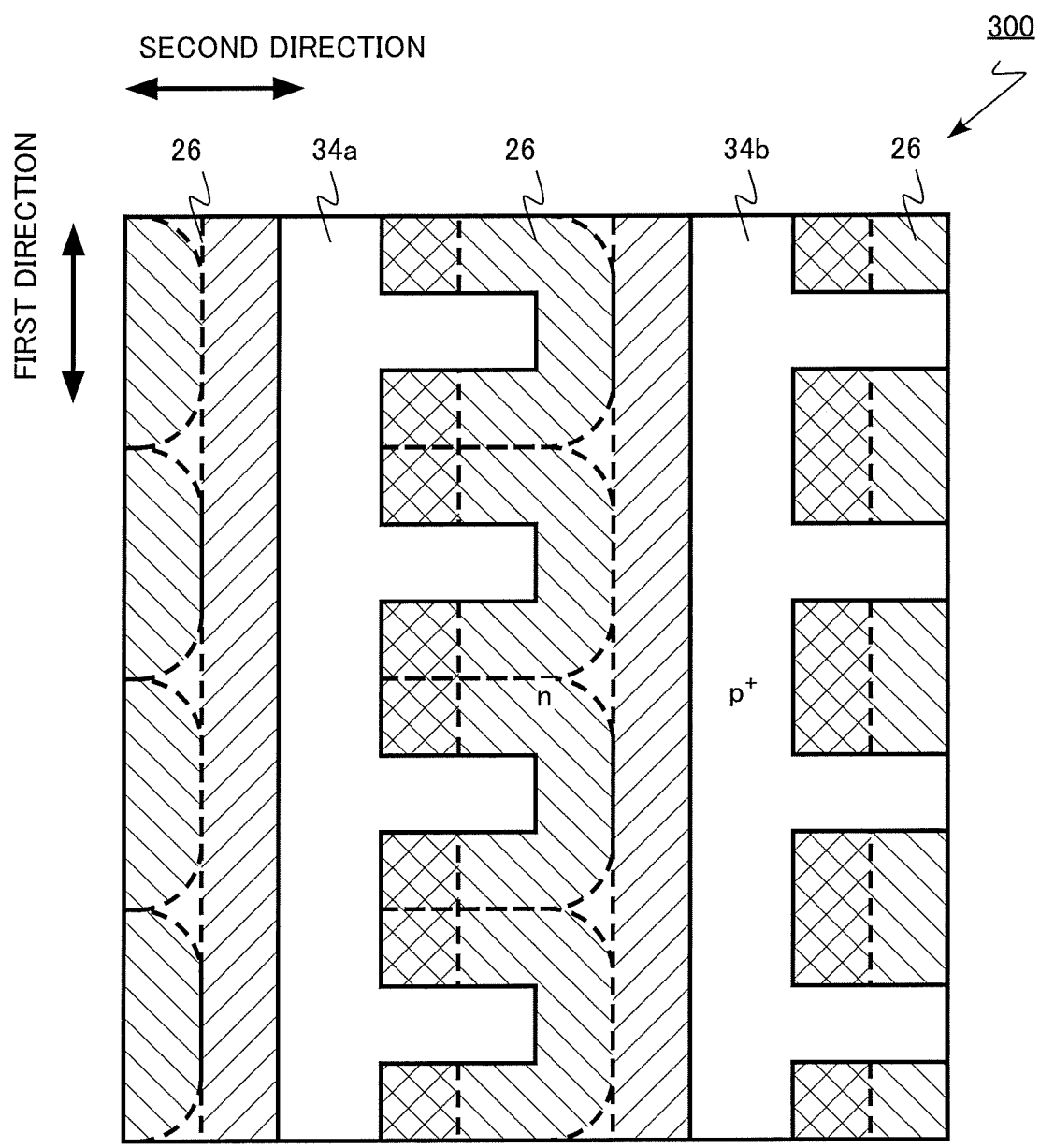
FIG. 28 is an explanatory diagram of a function and effect of the semiconductor device of the third embodiment.

FIG. 28 is an explanatory diagram of the function and effect of the semiconductor device of the third embodiment. FIG. 28 is a diagram schematically showing the extension of the depletion layer of the MOSFET 300 of the third embodiment. A hatched portion schematically shows a depletion layer in which the drift region 26 extends when the MOSFET 300 is turned off.

As shown in FIG. 28, since the depletion layer extends from the first lower electric field relaxation region 34a and the second lower electric field relaxation region 34b to the drift region 26, the strength of electric field applied to the gate insulating layer 18 at the bottom of the trench 22 is relaxed.

As described above, according to the MOSFET 300 of the third embodiment, the on-resistance is reduced as in the first embodiment. In addition, the breakdown voltage of the gate insulating layer 18 is improved, and the reliability is improved.

Fourth Embodiment

The inverter circuit and the driving device of the fourth embodiment are driving devices including the semiconductor device of the first embodiment.

Figure 29:
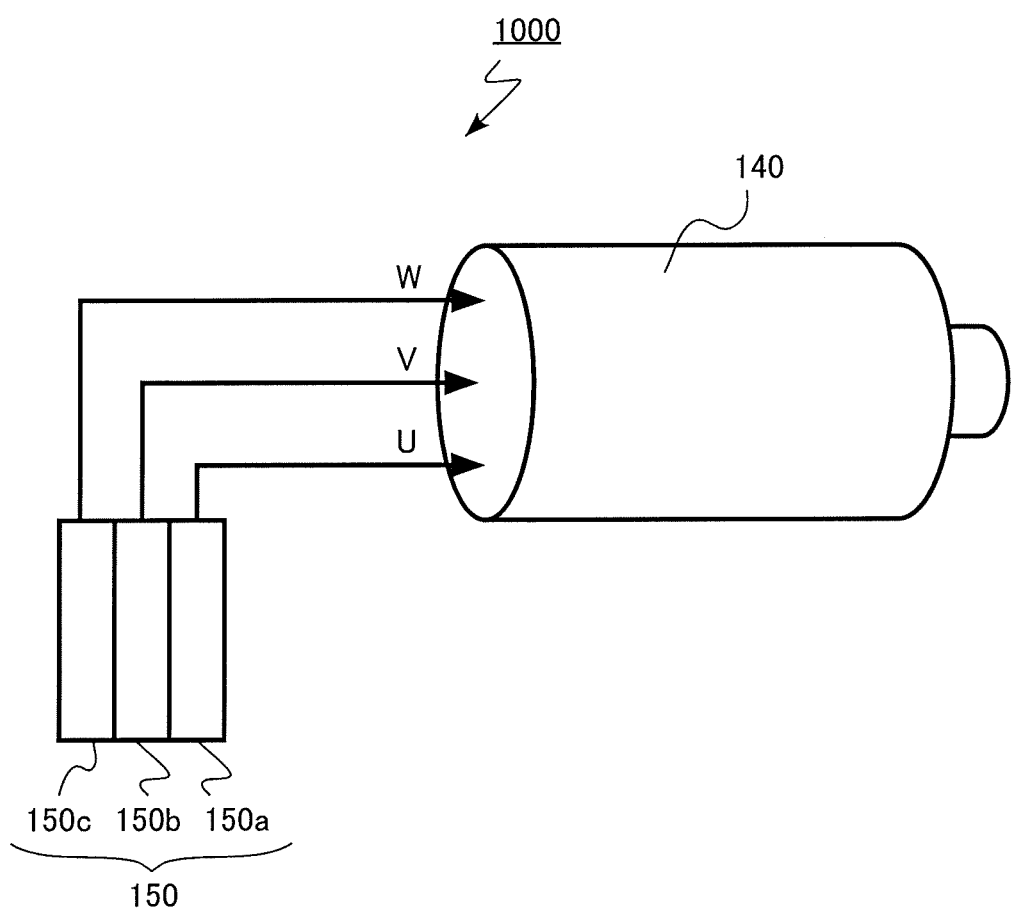
FIG. 29 is a schematic diagram of a driving device of a fourth embodiment.

FIG. 29 is a schematic diagram of the driving device of the fourth embodiment. A driving device 1000 includes a motor 140 and an inverter circuit 150.

The inverter circuit 150 is composed of three semiconductor modules 150a, 150b, 150c using the MOSFET 100 of the first embodiment as a switching element. The three semiconductor modules 150a, 150b, and 150c are connected in parallel to realize a three-phase inverter circuit 150 having three AC voltage output terminals U, V, W. The AC voltage output from the inverter circuit 150 drives the motor 140.

According to the fourth embodiment, since the inverter circuit 150 includes the MOSFET 100 having improved characteristics, the characteristics of the inverter circuit 150 and the driving device 1000 are improved.

Fifth Embodiment

The vehicle of the fifth embodiment is a vehicle including the semiconductor device of the first embodiment.

Figure 30:
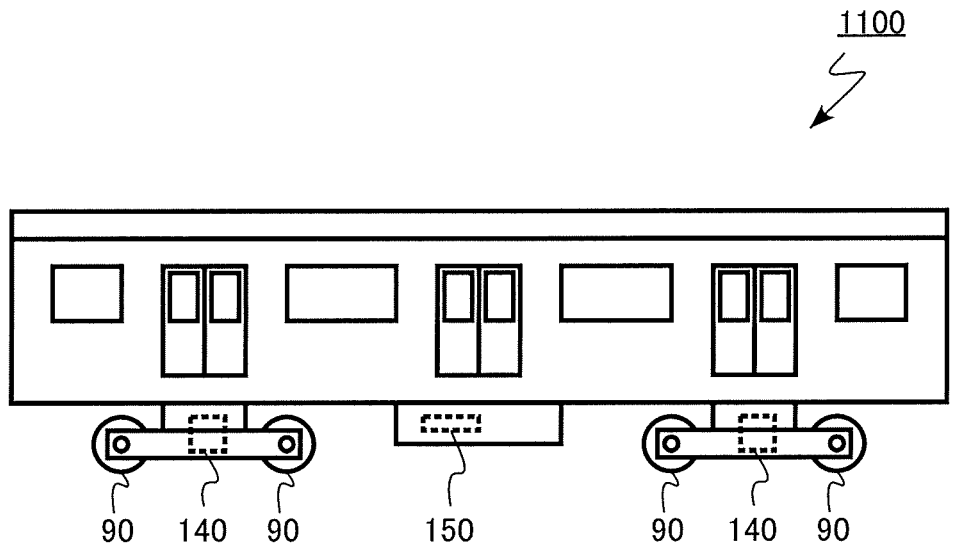
FIG. 30 is a schematic diagram of a vehicle of a fifth embodiment.

FIG. 30 is a schematic diagram of the vehicle of the fifth embodiment. A vehicle 1100 of the fifth embodiment is a railway vehicle. The vehicle 1100 includes a motor 140 and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, W. The AC voltage output from the inverter circuit 150 drives the motor 140. Wheels 90 of the vehicle 1100 are rotated by the motor 140.

According to the fifth embodiment, since the vehicle 1100 includes the MOSFET 100 having improved characteristics, the characteristics of the vehicle 1100 are improved.

Sixth Embodiment

The vehicle of the sixth embodiment is a vehicle including the semiconductor device of the first embodiment.

Figure 31:
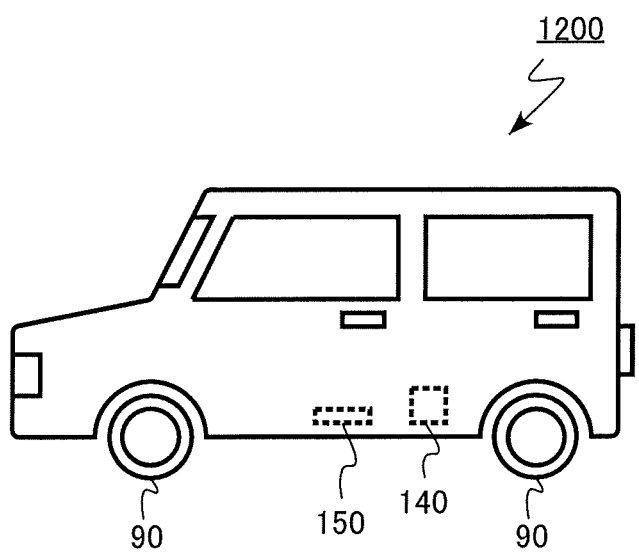
FIG. 31 is a schematic diagram of a vehicle of a sixth embodiment.

FIG. 31 is a schematic diagram of a vehicle according to the sixth embodiment. A vehicle 1200 of the sixth embodiment is a car. The vehicle 1200 includes a motor 140 and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, W.

The AC voltage output from the inverter circuit 150 drives the motor 140. Wheels 90 of the vehicle 1200 are rotated by the motor 140.

According to the sixth embodiment, since the vehicle 1200 includes the MOSFET 100 having improved characteristics, the characteristics of the vehicle 1200 are improved.

Seventh Embodiment

The elevator of the seventh embodiment is an elevator including the semiconductor device of the first embodiment.

Figure 32:
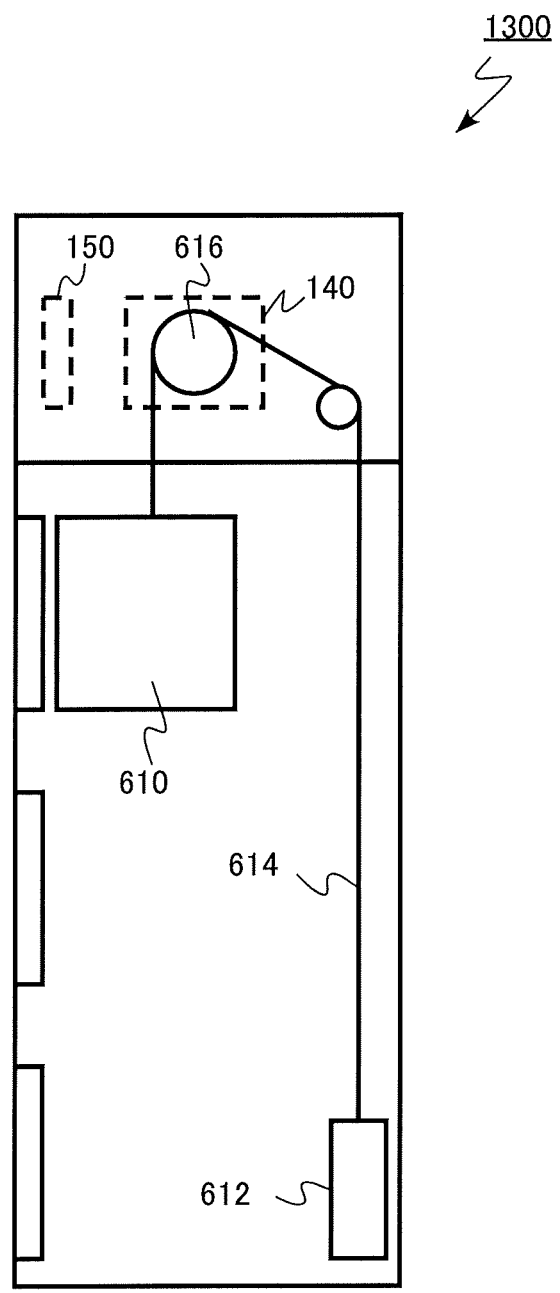
FIG. 32 is a schematic diagram of an elevator of a seventh embodiment.

FIG. 32 is a schematic diagram of the elevator of the seventh embodiment. An elevator 1300 of the seventh embodiment includes a car 610, a counterweight 612, a wire rope 614, a hoisting machine 616, a motor 140, and an inverter circuit 150.

The inverter circuit 150 is composed of three semiconductor modules using the MOSFET 100 of the first embodiment as a switching element. The three semiconductor modules are connected in parallel to realize a three-phase inverter circuit 150 having three AC voltage output terminals U, V, W.

The AC voltage output from the inverter circuit 150 drives the motor 140. The hoisting machine 616 is rotated by the motor 140 to move the car 610 up and down.

According to the seventh embodiment, since the elevator 1300 includes the MOSFET 100 having improved characteristics, the characteristics of the elevator 1300 are improved.

As described above, in the first to third embodiments, the case of 4H—SiC is described as an example of the crystal structure of silicon carbide. However, the present disclosure can also be applied to silicon carbide having other crystal structures such as 6H—SiC and 3C—SiC.

In the first to third embodiments, the MOSFET is described as an example of a semiconductor device, but the present disclosure can also be applied to an IGBT (Insulated Gate Bipolar Transistor). An IGBT can be realized by replacing the region corresponding to the drain region 24 of the MOSFET from n-type to p-type.

It is also possible to form a so-called superjunction structure in the drift region 26 of the first to third embodiments, and further reduce the on-resistance.

In the first embodiment, the case where the first regions 34ax and the second regions 34bx are alternately disposed one by one in the first direction has been described as an example. However, it is also possible to dispose them alternately, for example, two by two or more.

Further, in the fourth to seventh embodiments, the case of including the semiconductor device of the first embodiment has been described as an example, but it is also possible to apply the semiconductor device of the second embodiment or the third embodiment.

Further, in the fourth to seventh embodiments, the case of applying the semiconductor device of the present disclosure to a vehicle or an elevator has been described as an example, but it is also possible to apply the semiconductor device of the present disclosure to, for example, a power conditioner of a solar power generation system.

While certain embodiments have been described, these embodiments have been presented by way of example only, and are not intended to limit the scope of the inventions. Indeed, semiconductor device, inverter circuit, driving device, vehicle, and elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a silicon carbide layer having a first plane and a second plane facing the first plane, the first plane and the second plane being parallel to a first direction and a second direction perpendicular to the first direction;
    a first electrode located on a side of the first plane of the silicon carbide layer;
    a second electrode located on a side of the second plane of the silicon carbide layer;
    a trench provided in the silicon carbide layer, the trench extending in the first direction on the first plane, and the trench having a first side plane, a second side plane, and a bottom plane between the first side plane and the second side plane;
    a gate electrode located in the trench;
    a gate insulating layer located between the gate electrode and the silicon carbide layer;
    a first silicon carbide region of n-type located in the silicon carbide layer;
    a second silicon carbide region of p-type located in the silicon carbide layer and located between the first silicon carbide region and the first plane;
    a third silicon carbide region of p-type located in the silicon carbide layer and between the first silicon carbide region and the first plane, the trench being interposed between the second silicon carbide region and the third silicon carbide region;
    a fourth silicon carbide region of n-type located in the silicon carbide layer and located between the second silicon carbide region and the first plane;
    a fifth silicon carbide region of n-type located in the silicon carbide layer and between the third silicon carbide region and the first plane, the trench being interposed between the fourth silicon carbide region and the fifth silicon carbide region;
    a sixth silicon carbide region of p-type located in the silicon carbide layer and between the first silicon carbide region and the second silicon carbide region, a distance between the second plane and the sixth silicon carbide region being smaller than a distance between the second plane and the bottom plane, and the first silicon carbide region being interposed between the first side plane and the sixth silicon carbide region;
    a seventh silicon carbide region of p-type located in the silicon carbide layer and between the first silicon carbide region and the third silicon carbide region, a distance between the second plane and the seventh silicon carbide region being smaller than the distance between the second plane and the bottom plane, and the first silicon carbide region being interposed between the second side plane and the seventh silicon carbide region;
    a eighth silicon carbide region of p-type located in the silicon carbide layer, the eighth silicon carbide region being provided between the first silicon carbide region and the sixth silicon carbide region, the eighth silicon carbide region being connected to the sixth silicon carbide region, and a distance between the second plane and the eighth silicon carbide region being smaller than the distance between the second plane and the bottom plane; and
    a ninth silicon carbide region of p-type located in the silicon carbide layer, the ninth silicon carbide region being provided between the first silicon carbide region and the seventh silicon carbide region, the ninth silicon carbide region being connected to the seventh silicon carbide region, and a distance between the second plane and the ninth silicon carbide region being smaller than the distance between the second plane and the bottom plane, wherein
    the eighth silicon carbide region has a plurality of first regions extending toward the ninth silicon carbide region, the first silicon carbide region being interposed between the ninth silicon carbide region and the first regions, and the first regions being repeatedly disposed in the first direction in a plane parallel to the first direction and the second direction.

2. The semiconductor device according to claim 1, wherein the first silicon carbide region is interposed between the first regions and the bottom plane.

3. The semiconductor device according to claim 1, wherein the first silicon carbide region is interposed between one of the first regions and other one of the first regions neighboring the one of the first regions.

4. The semiconductor device according to claim 1, wherein each of the plurality of first regions has a first portion and a second portion located between the first portion and the ninth silicon carbide region, and a width of the second portion in the first direction is larger than a width of the first portion in the first direction.

5. The semiconductor device according to claim 4, wherein the second portion includes two protrusions protruding obliquely with respect to the second direction.

6. The semiconductor device according to claim 1, wherein a distance between each of the plurality of first regions and the ninth silicon carbide region is not more than half of a distance between the sixth silicon carbide region and the seventh silicon carbide region.

7. The semiconductor device according to claim 1, wherein the ninth silicon carbide region has a plurality of second regions extending toward the eighth silicon carbide region, the second regions interposing the first silicon carbide region between the eighth silicon carbide region and the second regions, and the second regions being repeatedly disposed in the first direction in a plane parallel to the first direction and the second direction.

8. The semiconductor device according to claim 7, wherein the first silicon carbide region is interposed between the second regions and the bottom plane.

9. The semiconductor device according to claim 7, wherein the first silicon carbide region is interposed between one of the second regions and other one of the second regions neighboring the one of the second regions.

10. The semiconductor device according to claim 7, wherein each of the plurality of second regions has a third portion and a fourth portion located between the third portion and the eighth silicon carbide region, and a width of the fourth portion in the first direction is larger than a width of the third portion in the first direction.

11. The semiconductor device according to claim 10, wherein the fourth portion includes two protrusions protruding obliquely with respect to the second direction.

12. The semiconductor device according to claim 7, wherein a distance between each of the plurality of second regions and the eighth silicon carbide region is not more than half of a distance between the sixth silicon carbide region and the seventh silicon carbide region.

13. The semiconductor device according to claim 7, wherein the first regions and the second regions are alternately disposed in the first direction.

14. The semiconductor device according to claim 7, wherein a disposition pitch of the first regions and a disposition pitch of the second regions are substantially equal.

15. The semiconductor device according to claim 1, wherein a p-type impurity concentration of the eighth silicon carbide region and the ninth silicon carbide region is higher than a p-type impurity concentration of the third silicon carbide region and the fourth silicon carbide region.

16. The semiconductor device according to claim 1, wherein the first silicon carbide region has a low-concentration region and a high-concentration region between the low-concentration region and the first plane, and an n-type impurity concentration of the high-concentration region is higher than an n-type impurity concentration of the low-concentration region.

17. An inverter circuit comprising a semiconductor device according to claim 1.

18. A driving device comprising a semiconductor device according to claim 1.

19. A vehicle comprising a semiconductor device according to claim 1.

20. An elevator comprising a semiconductor device according to claim 1.

* * * * *